United States Patent
Sengupta et al.

(10) Patent No.: US 11,777,650 B2
(45) Date of Patent: Oct. 3, 2023

(54) TONE-LEVEL INTERLEAVING AND DE-INTERLEAVING FOR BROADCAST OR MULTICAST COMMUNICATIONS

(71) Applicant: QUALCOMM Incorporated, San Diego, CA (US)

(72) Inventors: Ayan Sengupta, San Diego, CA (US); Alberto Rico Alvarino, San Diego, CA (US); Qiang Shen, San Diego, CA (US); Chu-Hsiang Huang, San Diego, CA (US); Cunzhen Liu, San Diego, CA (US); Yang Sun, San Diego, CA (US); Arash Mirbagheri, San Diego, CA (US); Gabi Sarkis, San Diego, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/985,883

(22) Filed: Aug. 5, 2020

(65) Prior Publication Data
US 2021/0044384 A1 Feb. 11, 2021

Related U.S. Application Data

(60) Provisional application No. 62/935,554, filed on Nov. 14, 2019, provisional application No. 62/885,137, filed on Aug. 9, 2019.

(51) Int. Cl.
| | |
|---|---|
| *H04L 1/00* | (2006.01) |
| *H04L 1/06* | (2006.01) |
| *H03M 13/27* | (2006.01) |
| *H03M 13/15* | (2006.01) |
| *H04L 27/26* | (2006.01) |

(Continued)

(52) U.S. Cl.
CPC .......... *H04L 1/0071* (2013.01); *H04L 1/0003* (2013.01); *H04L 1/0057* (2013.01);
(Continued)

(58) Field of Classification Search
CPC ......... H03M 13/2906; H03M 13/2778; H03M 13/271; H03M 13/27; H03M 13/15;
(Continued)

(56) References Cited

U.S. PATENT DOCUMENTS

| | | |
|---|---|---|
| 2018/0083736 A1 | 3/2018 | Manolakos et al. |
| 2018/0175981 A1* | 6/2018 | Manolakos ........... H04L 1/0071 |

(Continued)

OTHER PUBLICATIONS

International Search Report and Written Opinion—PCT/US2020/045256—ISA/EPO—dated Nov. 30, 2020.
(Continued)

*Primary Examiner* — April Y Blair
*Assistant Examiner* — Sazzad Hossain
(74) *Attorney, Agent, or Firm* — Procopio, Cory, Hargreaves & Savitch

(57) ABSTRACT

A base station maps code blocks of a transport block of a transport block size (TBS) for a channel using tone-level interleaving or resource element (RE)-level interleaving. Then, the base station can transmit the code blocks of the transport block of the TBS for the channel. A UE may receive the channel from the base station and de-interleave the received tones of the channel in a frequency domain to obtain the code blocks of the transport block having the TBS for the channel.

30 Claims, 14 Drawing Sheets

(51) Int. Cl.
*H04L 5/00* (2006.01)
*H03M 13/29* (2006.01)

(52) U.S. Cl.
CPC .......... *H04L 1/0606* (2013.01); *H04L 1/0643* (2013.01); *H03M 13/15* (2013.01); *H03M 13/27* (2013.01); *H03M 13/271* (2013.01); *H03M 13/2703* (2013.01); *H03M 13/2778* (2013.01); *H03M 13/2789* (2013.01); *H03M 13/2906* (2013.01); *H04L 1/0059* (2013.01); *H04L 1/065* (2013.01); *H04L 5/0023* (2013.01); *H04L 27/2607* (2013.01)

(58) Field of Classification Search
CPC .......... H03M 13/2703; H03M 13/2789; H04L 1/0071; H04L 1/0057; H04L 1/0059; H04L 27/2607; H04L 1/0643; H04L 1/065; H04L 5/0023; H04L 1/0003; H04L 1/0606
See application file for complete search history.

(56) References Cited

U.S. PATENT DOCUMENTS

| | | |
|---|---|---|
| 2018/0234863 A1 | 8/2018 | Li et al. |
| 2019/0098608 A1* | 3/2019 | Yi ........................ H04L 27/26 |
| 2019/0103942 A1* | 4/2019 | Wu ........................ H04L 5/0048 |
| 2019/0229860 A1* | 7/2019 | Yoshimura ............. H04L 1/0076 |
| 2020/0128448 A1* | 4/2020 | Müller .............. H04W 36/0058 |

OTHER PUBLICATIONS

Qualcomm Incorporated: Support of Longer Numerologies for Rooftop Reception, 3GPP Draft, 3GPP TSG-RAN WG1 #98, R1-1908841, 3rd Generation Partnership Project (3GPP), Mobile Competence Centre, 650, Route Des Lucioles, F-06921 Sophia-Antipolis Cedex, France, vol. RAN WG1, No. Prague, Czech Republic, 20190826-20190830, Aug. 17, 2019 (Aug. 17, 2019), XP051765449, 13 Pages, Retrieved from the Internet: URL: http://www.3gpp.org/ftp/tsg_ran/WG1_RL1/TSGR1_98/Docs/R1-1908841.zip, [retrieved on Aug. 17, 2019] section 4.5.

Qualcomm Incorporated: "Support of Longer Numerologies for Rooftop Reception", 3GPP Draft, 3GPP TSG-RAN WG1 #99, R1-1913247, 3rd Generation Partnership Project (3GPP), Mobile Competence Centre, 650, Route Des Lucioles, F-06921 Sophia-Antipolis Cedex, France, vol. RAN WG1, No. Reno, USA, 20191118-20191122, Nov. 16, 2019, XP051825969, 14 Pages, Retrieved from Internet: URL: https://ftp.3gpp.org/tsg_ran/WG1_RL1/TSGR1_99/Docs/R1-1913247.zip. R1-1913247—LongCP—updated.docx [retrieved on Nov. 16, 2019] the whole document.

* cited by examiner

TONE-LEVEL INTERLEAVING AND DE-INTERLEAVING FOR BROADCAST OR MULTICAST COMMUNICATIONS

CLAIM OF PRIORITY UNDER 35 U.S.C. § 119

The present Application for Patent claims priority to U.S. Provisional Patent Application No. 62/885,137, entitled "INTERLEAVING FOR PHYSICAL MULTICAST CHANNEL" filed Aug. 9, 2019, and U.S. Provisional Patent Application No. 62/935,554, entitled "INTERLEAVING FOR PHYSICAL MULTICAST CHANNEL" filed Nov. 14, 2019, which are assigned to the assignee hereof and hereby expressly incorporated by reference herein for all purposes.

TECHNICAL FIELD

The present disclosure relates generally to wireless communication systems, and more particularly, to tone- or resource element (RE)-level interleaving and de-interleaving of multiple code blocks of a physical channel.

DESCRIPTION OF RELATED TECHNOLOGY

Wireless communications systems are widely deployed to provide various types of communication content such as voice, video, packet data, messaging, broadcast, and so on. These systems may be capable of supporting communication with multiple users by sharing the available system resources (for example, time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

Some wireless communication systems may support broadcast or multicast communications to multiple user equipment (UEs) or other nodes in addition to unicast communications to specific UEs or nodes on an individual basis. A base station may transmit broadcast or multicast communications via broadcast or multicast channels such as, for example, a physical multicast channel (PMCH). A PMCH can be used to provide multimedia broadcast multicast service (MBMS) in 5G NR (or LTE). Some configurations of a broadcast or multicast channel may experience reduced performance due to limited frequency diversity. For example, a channel having a numerology with a long symbol duration and a long cyclic prefix (CP) may experience limited frequency diversity as a result of the localization of code blocks within a subset of tones of an associated bandwidth (e.g., a system bandwidth or assigned bandwidth part (BWP)). Additionally or alternatively, a channel configured with a large transport block size (TBS) also may experience limited frequency diversity for similar reasons. The limited frequency diversity may lead to reduced performance for the channel.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Some configurations of channels may experience reduced performance due to limited frequency diversity. For example, some channels, which may include a broadcast or multicast channel (e.g., physical multicast channel (PMCH), may have a numerology with a long symbol duration and a long cyclic prefix (CP). Channels configured with long symbol duration and long CP may experience limited frequency diversity as a result of the localization of code blocks within a subset of tones of the system bandwidth. Additionally or alternatively, a channel configured with a large transport block size (TBS) also may experience limited frequency diversity for similar reasons. The limited frequency diversity may lead to reduced performance for the channel. Aspects presented herein provide a tone-level interleaving within or across code blocks in order to increase the frequency diversity of the code blocks. The tone level-interleaving may also be referred to herein as a resource element (RE)-level interleaving. The increased frequency diversity for the code blocks of the channel may help to improve performance of the channel.

In some aspects of the disclosure, a method, a computer-readable medium, and an apparatus are provided for wireless communication at a base station. The base station maps code blocks of a transport block having a TBS for a channel using tone-level interleaving. The apparatus then transmits the code blocks of the transport block for the channel.

In some aspects of the disclosure, a method, a computer-readable medium, and an apparatus are provided for wireless communication at a user equipment (UE). The UE receives a channel for multicast or broadcast communications from a base station. The UE can performing tone-level de-interleaving of tone-level interleaved tones of the channel in a frequency domain, and obtain a plurality of code blocks of a transport block of the channel having a transport block size (TBS) based on the de-interleaving.

To the accomplishment of the foregoing and related ends, the one or more aspects include the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
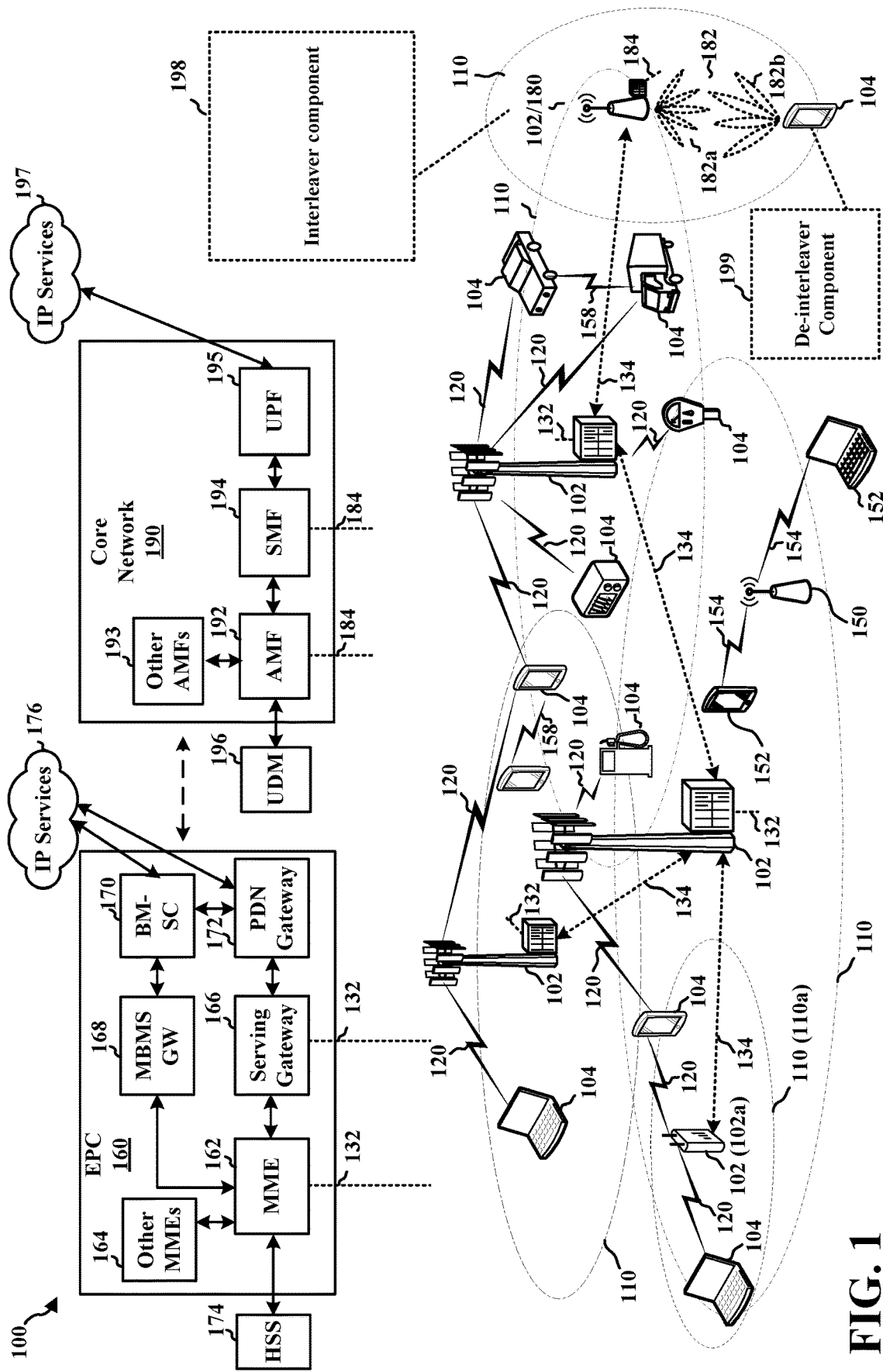
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, structures and components are shown in block diagram form in order to avoid obscuring such concepts.

Some wireless communication systems may support broadcast or multicast communications to multiple user equipment (UEs) or other nodes in addition to unicast communications to specific UEs or nodes on an individual basis. A base station may transmit broadcast or multicast communications via broadcast or multicast channels such as, for example, a physical multicast channel (PMCH). A PMCH can be used to provide multimedia broadcast multicast service (MBMS) in 5G NR (or LTE). Some configurations of a broadcast or multicast channel may experience reduced performance due to limited frequency diversity. For example, a channel having a numerology with a long symbol duration and a long cyclic prefix (CP) may experience limited frequency diversity as a result of the localization of code blocks within a subset of tones of an associated bandwidth (e.g., a system bandwidth or assigned bandwidth part (BWP)). Additionally or alternatively, a channel configured with a large transport block size (TBS) also may experience limited frequency diversity for similar reasons. The limited frequency diversity may lead to reduced performance for the channel.

Various aspects relate generally to tone-level interleaving and de-interleaving of code blocks of a channel. Some aspects more specifically relate to tone-level interleaving and de-interleaving (at each frequency tone) within or across code blocks of a transport block in order to increase the frequency diversity associated with the transmission of the code blocks. The tone-level interleaving and de-interleaving may also be referred to herein as resource element (RE)-level interleaving and de-interleaving as one RE may represent a resource defined by one tone (or subcarrier) over one symbol duration. Although some aspects are described herein in terms of code blocks, the disclosed techniques can be similarly applied to code block groups to achieve similar results, where each code block group may include multiple code blocks taken together as an entity to which communications can be mapped and for which feedback can be reported.

Some implementations more specifically relate to inter-code block interleaving for the channel. Some other implementations more specifically relate to intra-code block interleaving for the channel. In some other implementations, a combination of intra-code block interleaving and inter-code block interleaving for the channel may be used. In some implementations, the interleaving may include applying row-column interleaving. For example, code blocks can be written to a table by writing the tones of a first code block in successive columns of a first row, writing the tones of a second code block in successive columns of a second row, and so on for each other code block. To map the code blocks to frequency tones, the code blocks can be retrieved from the table on a column-by-column basis for mapping to the frequency tones, such that the rows of the first column are mapped to frequency tones first, then the rows of the second column are mapped to frequency, and so on. In some other examples, column-row interleaving may be used.

Particular implementations of the subject matter described in this disclosure can be implemented to realize one or more of the following potential advantages. In some implementations, the described techniques can be used to improve system performance of a channel, such as a broadcast or multicast channel, which may include a physical multicast channel (PMCH). For example, the techniques may be used to increase the frequency diversity associated with the code blocks transmitted via the channel, which may improve performance of the channel. In this regard, a base station can perform the tone-level interleaving for broadcast or multicast channel communications, which can be transmitted to multiple UEs simultaneously, which may then perform tone-level de-interleaving to obtain the code blocks and otherwise process the broadcast or multicast channel communications received from the base station.

Several aspects of telecommunication systems will now be presented with reference to various apparatus and methods. These apparatus and methods will be described in the following detailed description and illustrated in the accompanying drawings by various blocks, components, circuits, processes, algorithms, among other examples (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, among other examples, whether referred to as software, firmware, middleware, microcode, hardware description language, or otherwise.

Accordingly, in one or more examples, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (for example, a 5G Core (5GC)). The base stations 102 may include macrocells (high power cellular base station) or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (for example, an S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (for example, handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (for example, through the EPC 160 or core network 190) with each other over third backhaul links 134 (for example, X2 interface). The third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102a may have a coverage area 110a that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 or downlink (DL) (also referred to as forward link) transmissions from a base station 102 to a UE 104. The communication links 120 may use multiple-input and multiple-output (MIMO) antenna technology, including spatial multiplexing, beamforming, or transmit diversity. The communication links may be through one or more carriers. The base stations 102/UEs 104 may use spectrum up to Y MHz (for example, 5, 10, 15, 20, 100, 400 MHz, among other examples) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (for example, more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102a may operate in a licensed or an unlicensed frequency spectrum. When operating in an unlicensed frequency spectrum, the small cell 102a may employ NR and use the same 5 GHz unlicensed frequency spectrum as used by the Wi-Fi AP 150. The small cell 102a, employing NR in an unlicensed frequency spectrum, may boost coverage to or increase capacity of the access network.

A base station 102, whether a small cell 102a or a large cell (for example, macro base station), may include or be referred to as an eNB, gNodeB (gNB), or another type of base station. Some base stations, such as gNB 180 may operate in a traditional sub 6 GHz spectrum, in millimeter wave (mmW) frequencies, or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band (for example, 3 GHz-300 GHz) has extremely high path loss and a short range. The mmW base station 180 may utilize beamforming 182 with the UE 104 to compensate for the extremely high path loss and short range. The base station 180 and the UE 104 may each include a plurality of antennas, such as antenna elements, antenna panels, or antenna arrays to facilitate the beamforming.

The base station 180 may transmit a beamformed signal to the UE 104 in one or more transmit directions 182a. The UE 104 may receive the beamformed signal from the base station 180 in one or more receive directions 182b. The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, or other IP services.

The base station may include or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (for example, MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (for example, parking meter, gas pump, toaster, vehicles, heart monitor, among other examples). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in some implementations, the base station 102 or 180 may include an interleaver component 198 configured to map code blocks of one or more transport blocks corresponding to a TBS for a channel (e.g., PMCH) using RE-level interleaving. The base station 102 or 180 may transmit the code blocks of the one or more transport blocks for the channel after the interleaving. The interleaving may include at least one of inter-code block interleaving or intra-code block interleaving. UE 104 may receive the channel transmitted by the base station 102 or 180. In some implementations, UE 104 may include a de-interleaver component 199 configured to de-interleave the received tones of the channel in a frequency domain to obtain code blocks of one or more transport blocks corresponding to a TBS for the channel. Although the following description may be described in terms of 5G NR, the concepts described herein may be applicable to other similar areas, such as LTE, LTE-A, CDMA, GSM, and other wireless technologies. In some examples, the concepts may be applied to substantially any type of multicast or broadcast channel (or other channel) to provide additional frequency diversity.

Figure 2:
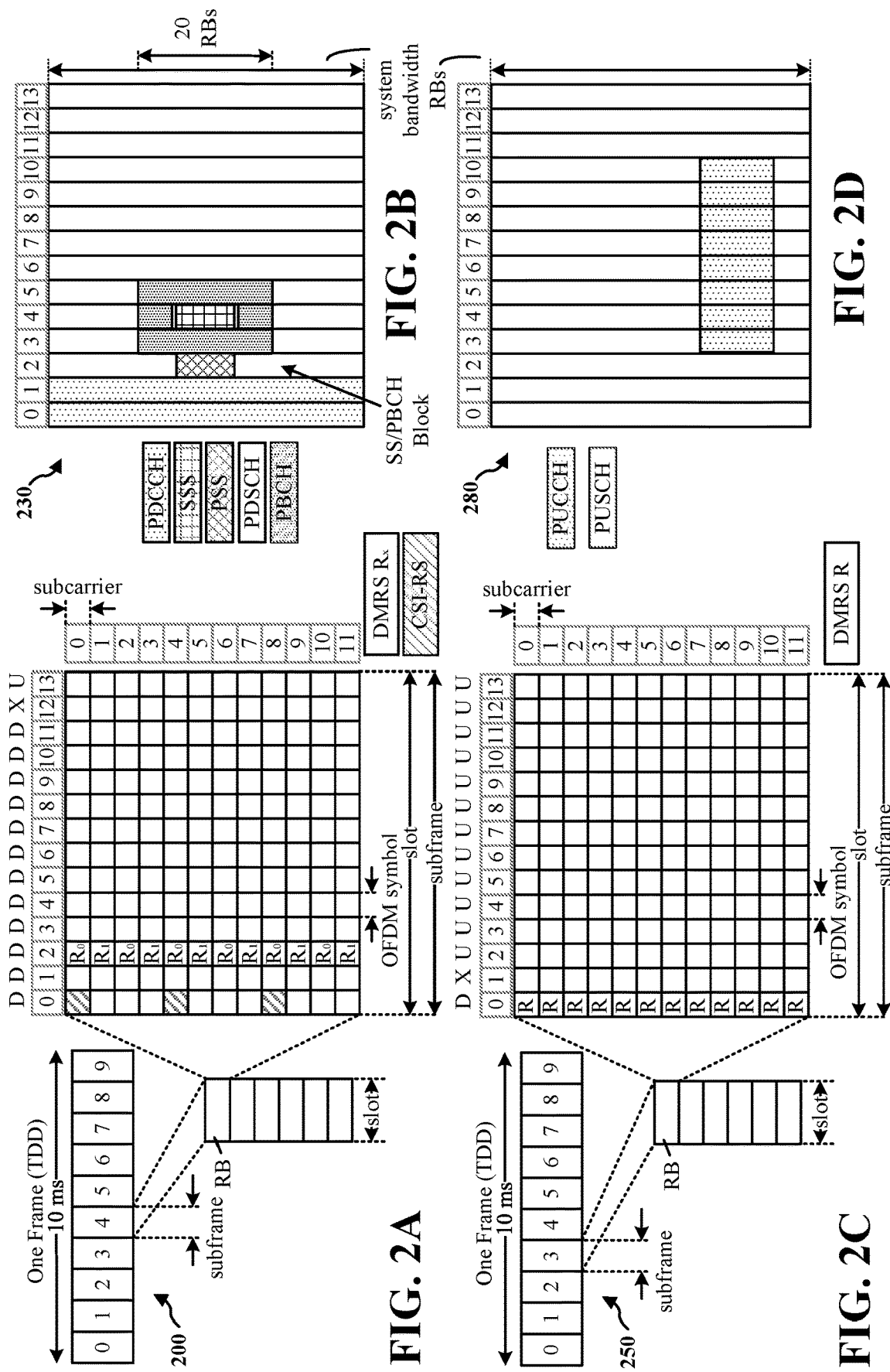
FIGS. 2A, 2B, 2C, and 2D are diagrams illustrating examples of a first 5G/NR frame, DL channels within a 5G/NR subframe, a second 5G/NR frame, and UL channels within a 5G/NR subframe, respectively.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies µ0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology µ, there are 14 symbols/slot and $2^\mu$ slots/subframe. The subcarrier spacing and symbol length/duration are a function of the numerology. The subcarrier spacing may be equal to $2^\mu*15$ kHz, where µ is the numerology 0 to 5. As such, the numerology µ=0 has a subcarrier spacing of 15 kHz and the numerology µ=5 has a subcarrier spacing of 480 kHz. The symbol length/duration is inversely related to the subcarrier spacing. FIGS. 2A-2D provide an example of slot configuration 0 with 14 symbols per slot and numerology µ=0 with 1 slot per subframe. The subcarrier spacing is 15 kHz and symbol duration is approximately 66.7 µs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. Although not shown, the UE may transmit sounding reference signals (SRS). The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), or UCI.

Figure 3:
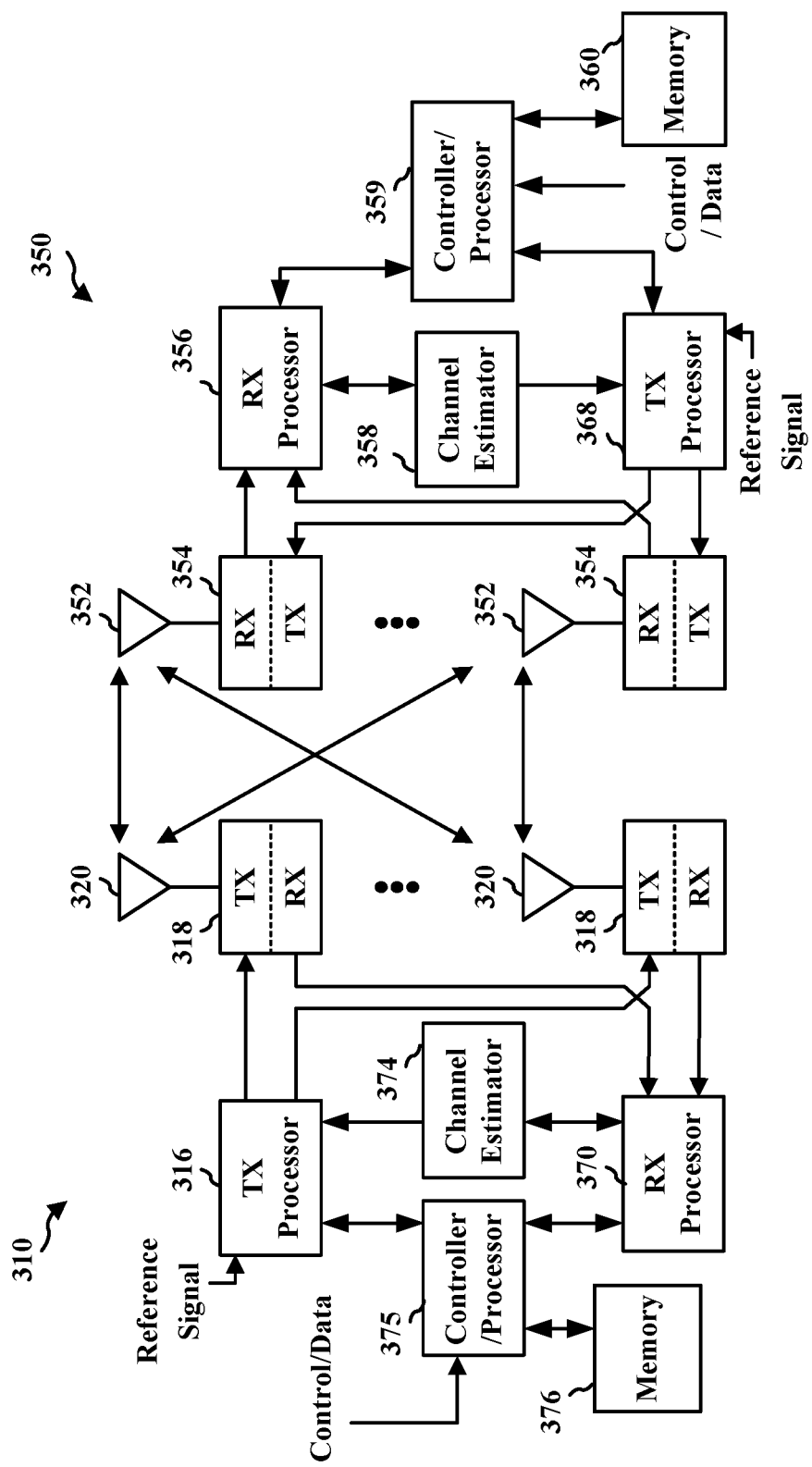
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (such as MIB, SIBs), RRC connection control (such as RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (such as binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (such as a pilot) in the time or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK or NACK protocol to support HARQ operations.

Similar to the functionality described in connection with the DL transmission by the base station 310, the controller/processor 359 provides RRC layer functionality associated with system information (for example, MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK or NACK protocol to support HARQ operations.

At least one of the TX processor 368, the RX processor 356, and the controller/processor 359 may be configured to perform aspects in connection with 199 of FIG. 1.

At least one of the TX processor 316, the RX processor 370, and the controller/processor 375 may be configured to perform aspects in connection with 198 of FIG. 1.

Figures 4A, 4B, 4C:
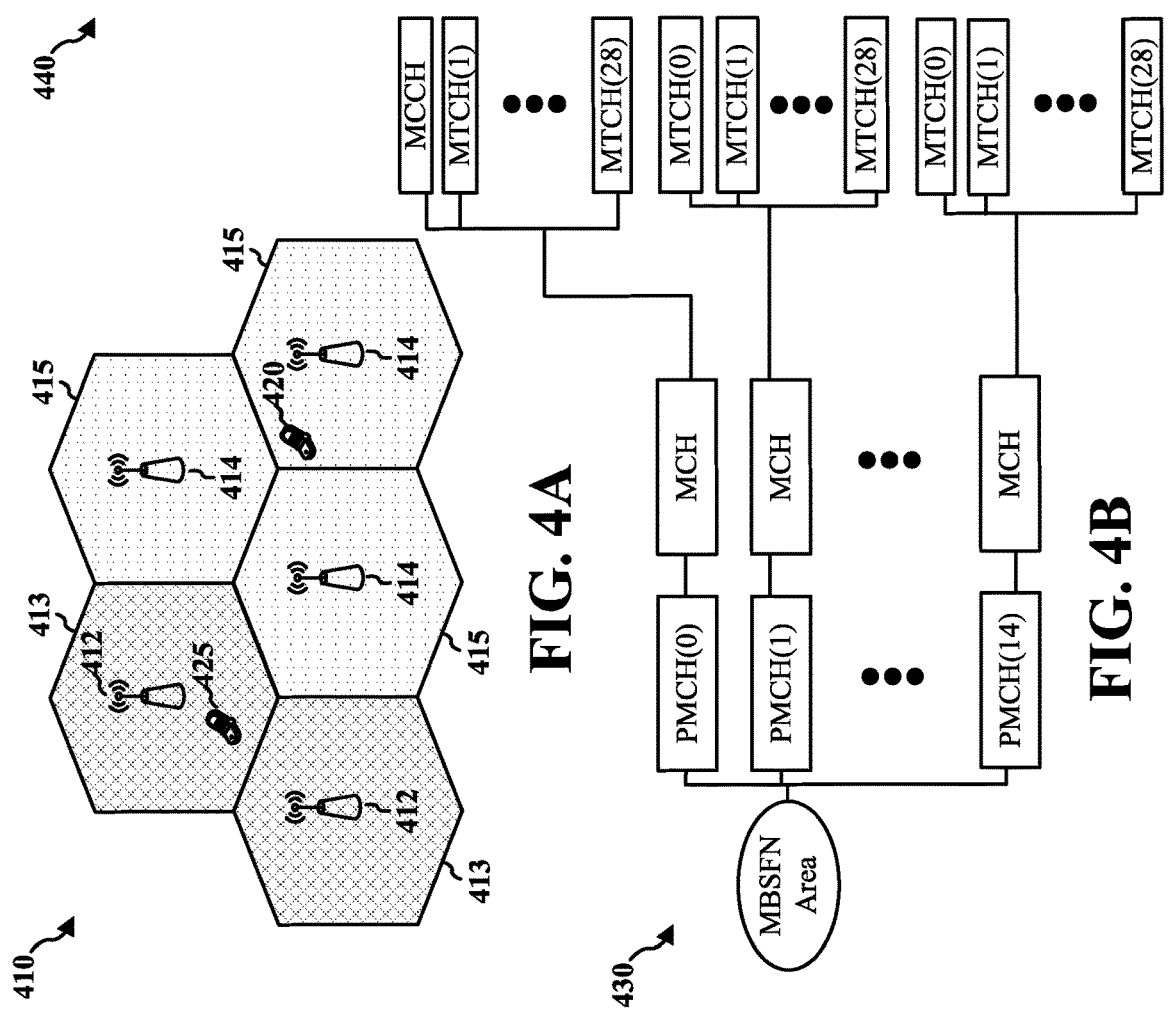
FIG. 4A is a diagram illustrating an example of Multicast Broadcast Single Frequency Network areas in an access network.
FIG. 4B is a diagram illustrating an example of an evolved Multimedia Broadcast Multicast Service channel configuration in a Multicast Broadcast Single Frequency Network.
FIG. 4C is a diagram illustrating a format of a Multicast Channel (MCH) Scheduling Information (MSI) Medium Access Control element.

FIG. 4A is a diagram 410 illustrating an example of MBSFN areas in an access network. The base stations 412 in cells 413 may form a first MBSFN area and the base stations 414 in cells 415 may form a second MBSFN area. The base stations 412, 414 may each be associated with other MBSFN areas, for example, up to a total of eight MBSFN areas. A cell within an MBSFN area may be designated a reserved cell. Reserved cells do not provide multicast/broadcast content, but are time-synchronized to the cells 413, 415 and may have restricted power on MBSFN resources in order to limit interference to the MBSFN areas. Each base station in an MBSFN area synchronously transmits the same eMBMS control information and data. Each area may support broadcast, multicast, and unicast services. A unicast service is a service intended for a specific user, for example, a voice call. A multicast service is a service that may be received by a group of users, for example, a subscription video service. A broadcast service is a service that may be received by all users, for example, a news broadcast. Referring to FIG. 4A, the first MBSFN area may support a first eMBMS broadcast service, such as by providing a particular news broadcast to UE 425. The second MBSFN area may support a second eMBMS broadcast service, such as by providing a different news broadcast to UE 420.

FIG. 4B is a diagram 430 illustrating an example of an eMBMS channel configuration in an MBSFN. As shown in FIG. 4B, each MBSFN area supports one or more physical multicast channels (PMCH) (for example, 15 PMCHs). Each PMCH corresponds to an MCH. Each MCH can multiplex a plurality (for example, 29) of multicast logical channels. Each MBSFN area may have one multicast control channel (MCCH). As such, one MCH may multiplex one MCCH and a plurality of multicast traffic channels (MTCHs) and the remaining MCHs may multiplex a plurality of MTCHs.

A UE can camp on a cell to discover the availability of eMBMS service access and a corresponding access stratum configuration. Initially, the UE may acquire system information, for example a SIB, such as SIB 13 (SIB13). Subsequently, based on the SIB, the UE may acquire an MBSFN Area Configuration message on an MCCH. Subsequently, based on the MBSFN Area Configuration message, the UE may acquire an MSI MAC control element. The SIB may include (1) an MBSFN area identifier of each MBSFN area supported by the cell; (2) information for acquiring the MCCH such as an MCCH repetition period (for example, 32, 64, ..., 256 frames), an MCCH offset (for example, 0, 1, ..., 10 frames), an MCCH modification period (for example, 512, 1024 frames), a signaling modulation and coding scheme (MCS), subframe allocation information indicating which subframes of the radio frame as indicated by repetition period and offset can transmit MCCH; and (3) an MCCH change notification configuration. There may be one MBSFN Area Configuration message for each MBSFN area. The MBSFN Area Configuration message may indicate (1) a temporary mobile group identity (TMGI) and an optional session identifier of each MTCH identified by a logical channel identifier within the PMCH, and (2) allocated resources (for example, radio frames and subframes) for transmitting each PMCH of the MBSFN area and the allocation period (for example, 4, 8, ..., 256 frames) of the allocated resources for all the PMCHs in the area, and (3) an MCH scheduling period (MSP) (for example, 8, 16, 32, ..., or 1024 radio frames) over which the MSI MAC control element is transmitted. A particular TMGI identifies a particular service of available MBMSs services.

FIG. 4C is a diagram 440 illustrating the format of an MSI MAC control element. The MSI MAC control element may be sent once each MSP. The MSI MAC control element may be sent in the first subframe of each scheduling period of the PMCH. The MSI MAC control element can indicate the stop frame and subframe of each MTCH within the PMCH. There may be one MSI per PMCH per MBSFN area. A logical channel identifier (LCID) field (for example, LCID 1, LCID 2, ..., LCID n) may indicate a logical channel identifier of the MTCH. A Stop MTCH field (for example, Stop MTCH 1, Stop MTCH 2, ..., Stop MTCH n) may indicate the last subframe carrying the MTCH corresponding to the particular LCID.

As described in connection with FIGS. 2A-2D, communication may be based on different numerologies. Additional numerologies (such as ones with different $T_u$, $T_{CP}$, among other examples) may be used. $T_u$ corresponds to a usable symbol duration, and $T_{CP}$ corresponds to a CP duration. In some examples, the additional numerologies may be used for 5G Cellular Broadcast (such as enhanced TV (EnTV)) in various scenarios.

One such numerology is a Long CP numerology. For example, a long CP numerology may have $T_u \approx 2.7$ ms, $T_{CP} \approx 0.3$ ms, and/or may be used to serve large inter-site-distances between cooperating MBSFN cells (e.g., in a rooftop reception scenario). A corollary of a long CP numerology may include a large Transport Block Size (TBS) for each symbol of a transmitted channel (e.g., a Physical Multicast Channel (PMCH)).

Figure 5:
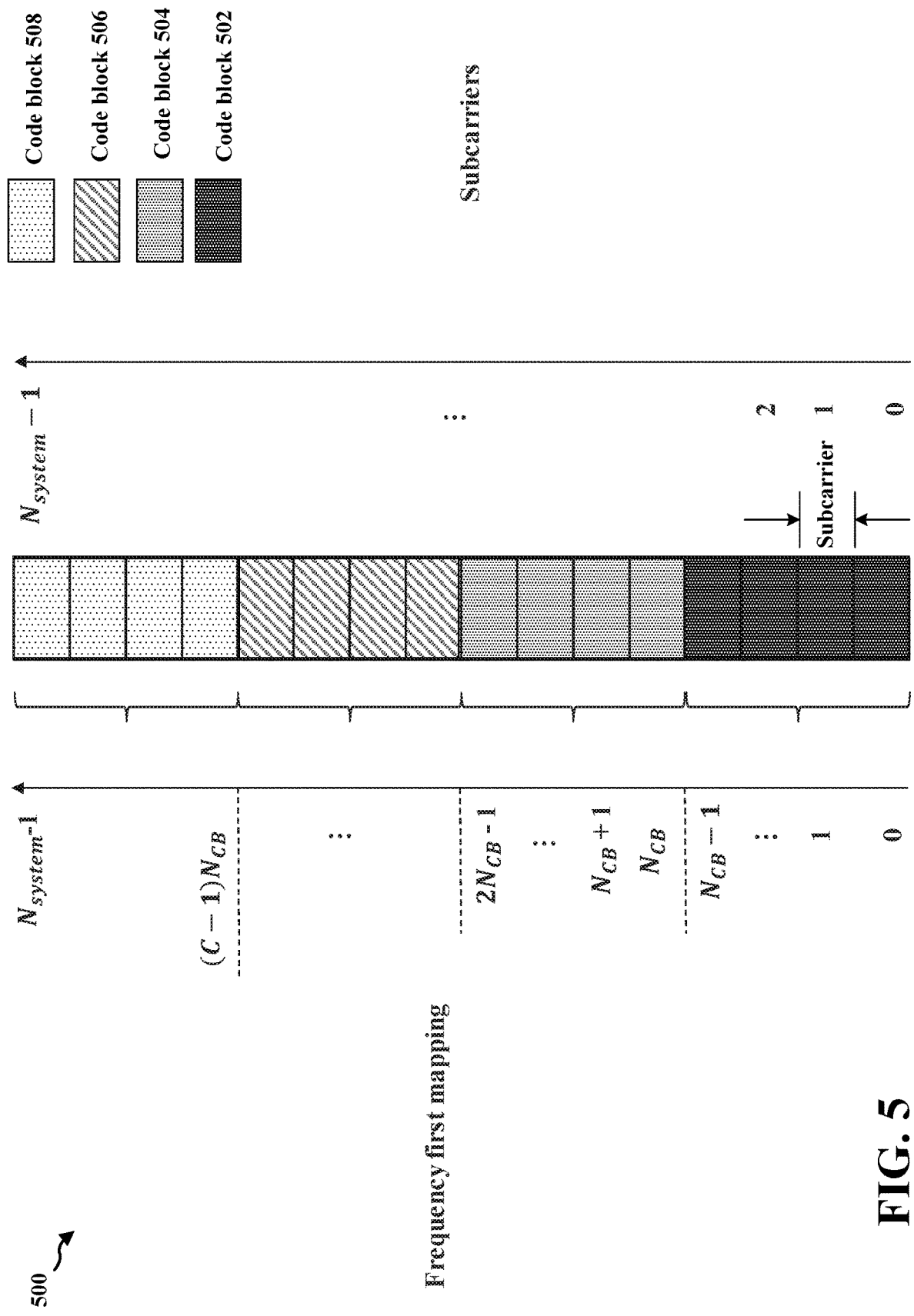
FIG. 5 is a diagram illustrating a frequency first mapping of code blocks of a channel to frequency resources.

Increasing the size of a TBS increases the number of code blocks in each symbol. For example, in the Third Generation Partnership Project (3GPP) Technical Specification (TS) 36.212, a number of code blocks, C, for a given TBS (e.g., for a transport block of the TBS) may be given by $C=\lceil TBS/(6144-24)\rceil$. As each code block may be mapped to the individual tones in a frequency-first manner, each code block may be mapped to a fraction 1/C of the system bandwidth. When the number of code blocks, C, is large, the fraction of the system bandwidth 1/C will be small. The mapping of a code block to the fraction 1/C of the system bandwidth may lead to a lack of frequency diversity for each code block when C is large. FIG. 5 is a diagram illustrating a frequency first mapping 500 of code blocks of a channel to frequency resources. In FIG. 5, the number of code blocks C for the TBS corresponds to $C=\lceil TBS/(6144-24)\rceil$. $N_{system}$ is the total number of subcarriers in the system bandwidth. The number of tones occupied by each code block is $$N_{CB} = \frac{N_{system}}{C}.$$

For a coding rate r, the number of tones occupied by the systematic bits of each code block=$N_{CB}^{systematic}$=r×$N_{CB}$. FIG. 5 illustrates that each code block is mapped to a fraction of the system bandwidth (or associated BWP). For example, the code block 502 is mapped to subcarriers 0–($N_{CB}$–1). The code block 504 is mapped to subcarriers $N_{CB}$–(2$N_{CB}$–1). The code block 506 is mapped to subcarriers 2$N_{CB}$–(3$N_{CB}$–1), and so forth until the code block 508 is mapped to subcarriers (C–1)$N_{CB}$–($N_{system}$–1).

As described above, a channel having a numerology with a long symbol duration and a long cyclic prefix (CP) may experience limited frequency diversity as a result of the localization of code blocks within a subset of tones of the system bandwidth. Additionally or alternatively, a channel configured with a large transport block size (TBS) also may experience limited frequency diversity for similar reasons. The limited frequency diversity may lead to reduced performance for the channel. Aspects presented herein provide a tone-level interleaving within or across code blocks in order to increase the frequency diversity of the code blocks. The tone level-interleaving may also be referred to herein as a resource element (RE)-level interleaving, and may include interleaving the code blocks (or code block groups) in consecutive or adjacent REs (or tones) of the system bandwidth (or associated BWP). The increased frequency diversity for the code blocks of the channel may help to improve performance of the channel.

In various implementations, the frequency diversity of the code blocks of the channel may be improved using tone-level or RE-level interleaving within a code block (inter-code-block interleaving) or across code blocks (intra-code-block interleaving). For example, a base station may apply a row-column interleaver to the code blocks of the channel. In some implementations, the base station may apply the row-column interleaver for inter-code-block interleaving. Additionally or alternatively, the base station may apply the row-column interleaver (or a different interleaver) for intra-code-block interleaving. In some examples, the base station may apply the intra-code block interleaving to spread the systematic bits of the code block across the code block bandwidth, and the base station may apply the inter-code block interleaving to spread the code block mapping across the system bandwidth.

The row-column interleaving may include writing the RE (or tone) indices of a system to a matrix in a row-wise manner and then reading the RE (or tone) indices from the matrix in a column-wise manner to obtain the interleaved indices. In this example, row-column interleaving of the code blocks can include writing the code blocks to RE indices in a row-wise manner and then reading the code blocks to map to the actual REs of the system bandwidth (or associated BWP) in a column-wise manner. In addition, in this example, the number of rows of the matrix may be based on (for example, equal to) the number of code blocks, C. By using C rows, each code block experiences the frequency selectivity of the entire channel. Nil elements may be inserted as remainders in the code block generation. As another example, the tone indices of a system may be written column-wise and the tone indices may then be read row-wise to obtain the interleaved indices. In such an example, the role of rows and columns described above may be interchanged. For example, the number of columns may depend on the number of code blocks.

Figure 6:
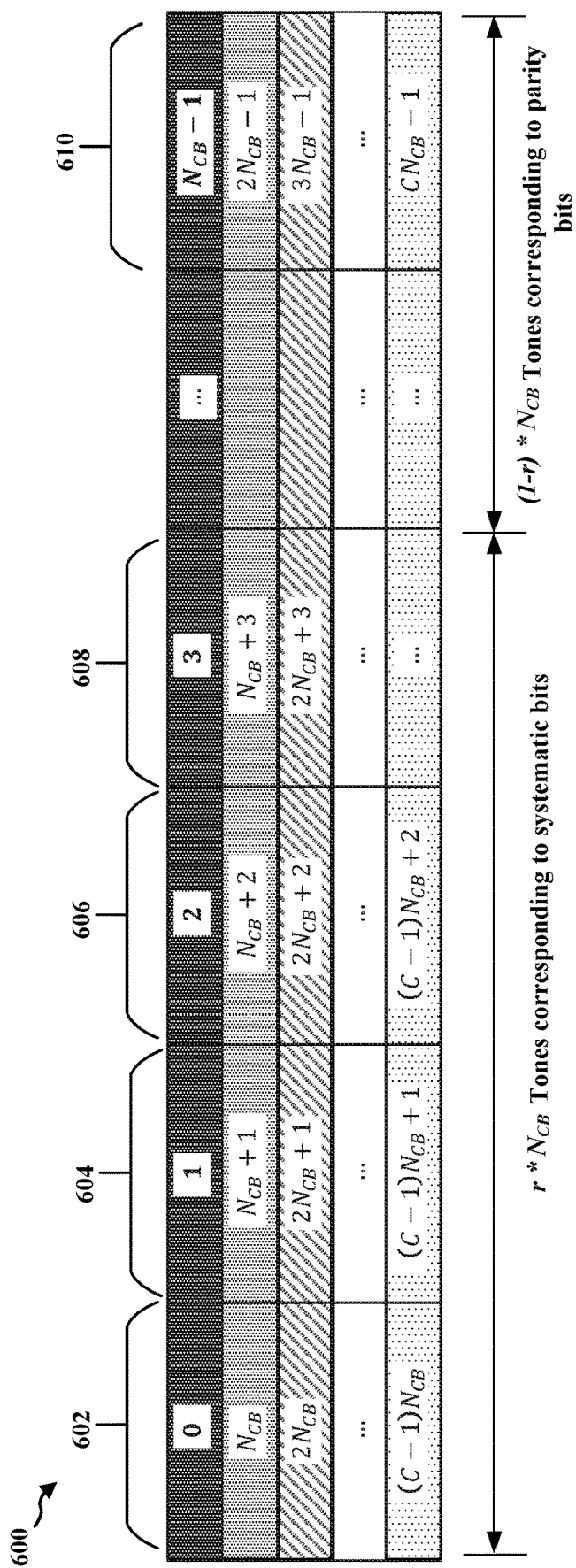
FIG. 6 is an example of a matrix for row-column interleaving of code blocks in accordance with some aspects of the presented disclosure.

FIG. 6 is an example of a matrix 600 for row-column interleaving of code blocks. In FIG. 6, prior to subcarrier mapping, the RE (or tone) indices are written to the matrix 600 along rows. For example, the tone indices can be written to the matrix 600 in a memory for a subsequent tone mapping process, as described below. For example, the first row of the matrix 600 includes, in each column 602, 604, 606, 608, 610, tone index 0, tone index 1, tone index 2, tone index 3, and so forth up to tone index ($N_{CB}$–1). The second row of the matrix 600 includes tone indices $N_{CB}$–(2$N_{CB}$–1). The third row of the matrix 600 includes tone indices 2$N_{CB}$–(3$N_{CB}$–1), and so forth until the last row of the matrix includes tone indices (C–1)$N_{CB}$–($N_{system}$–1). The number of columns in each row corresponds to the number of tones in each code block, $N_{CB}$, and the number of rows corresponds to the number of code blocks. $N_{system}$ represents the number of tones in the system bandwidth (or associated BWP). The code blocks 612, 614, 616, and 618 each have tone indices written in a row of the matrix. The indices are read along a column in order to map the tone indices to the subcarriers.

Figure 7:
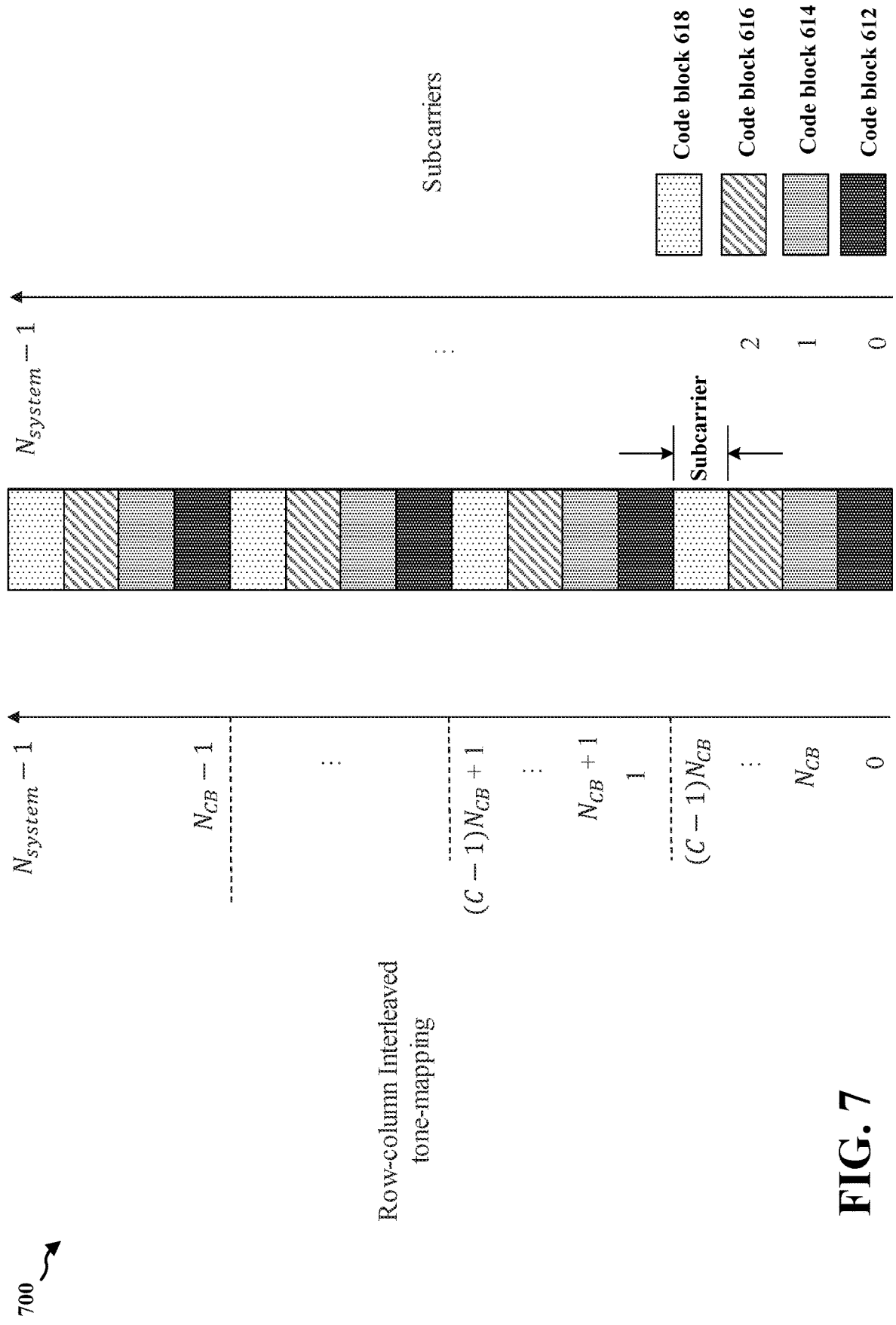
FIG. 7 is a diagram illustrating an example of a row-column interleaved tone mapping of code blocks in accordance with some aspects of the presented disclosure.

FIG. 7 is a diagram illustrating an example of a row-column interleaved tone mapping 700 of code blocks. The mapped indices in FIG. 7 correspond to a column-wise reading of the example matrix illustrated in FIG. 6 (e.g., and/or as stored in memory, as described). As an example, reading along the first column in the matrix 600 of FIG. 6, tone index 0 of code block 612 is mapped to subcarrier 0 in FIG. 7. The next tone index in the column of matrix 600 is $N_{CB}$ of code block 614 and is mapped to subcarrier 1 in FIG. 7. The next tone index in the column of matrix 600 is 2$N_{CB}$ of code block 616 and is mapped to subcarrier 2 in FIG. 7. The pattern continues for any number of code blocks, until the tone index 3$N_{CB}$ of code block 618 is mapped to a subcarrier 3. After the tone indices of the first column of the matrix 600 are mapped to the subcarriers of the system bandwidth, the tone indices of the second column of the matrix 600 are mapped to the subcarriers. The pattern continues until each of the columns of tone indices are mapped to the subcarriers. As illustrated, the tones of the individual code blocks, for example, the code blocks 612, 614, 616, and 618, are mapped to subcarriers (or tones or REs) that are spread across the system bandwidth. The increase in frequency diversity for the code blocks may help to improve channel performance of the channel being mapped using the row-column interleaving.

Although the examples described with reference to FIGS. 6 and 7 illustrate a mapping using a single tone or a single resource element as a unit for interleaving the code blocks, the interleaving may also be applied using a granularity that is based on a contiguous group of REs. For example, the base unit for the interleaving may be a block of a number of REs, such as 12 REs, 24 REs, 48 REs, or 96 REs. In some other examples, the base unit for interleaving may be a number of Physical Resource Blocks (PRBs).

The base station may apply the tone level or RE-level interleaving based on a numerology of the PMCH. For example, interleaving may be applied for some numerologies and not for other numerologies. For example, interleaving may not be enabled for a first MBMS numerology of $T_u$=0.8 ms, $T_{CP}$=0.2 ms, while interleaving may be enabled for a second numerology having a longer CP duration (for example, a "long-CP numerology"). The first numerology may not benefit as much from interleaving, because the first numerology includes a smaller number of code blocks per PMCH symbol. Therefore, each code block may experience a larger fraction of the system bandwidth than the code blocks of the second numerology. Applying interleaving for some numerologies and not for others may help to facilitate backwards compatibility with earlier MBMS numerologies.

The base station may apply the tone level or RE-level interleaving based on a system bandwidth (or associated BWP) for or assigned by the base station. A lower system bandwidth can reduce the frequency diversity that can be achieved with interleaving and can reduce the benefits that can be achieved through interleaving. Additionally, a lower system bandwidth may lead to a smaller TBS configuration, resulting in a lower number of code blocks per PMCH symbol. As such, the gain in frequency diversity resulting from interleaving may not be worth the added complexity required when the system bandwidth is below a threshold bandwidth. As an example, an interleaver at a base station may be enabled based on a system bandwidth (or associated assigned BWP), such as a system bandwidth reported in an MIB. In some examples, a base station may not apply interleaving for a 1.4 MHz system bandwidth, and may apply interleaving for a larger system bandwidth, such as 5 MHz or 10 MHz.

The interleaving may be enabled for some or all MCS/TBS combinations for the 5 MHz or 10 MHz system bandwidth. For example, a base station may apply interleaving for each MCS/TBS combination for a wider system bandwidth, such as 20 MHz. In some examples, the interleaver that is applied by the base station may be different for different system bandwidths. This is merely an example. In some other examples, the base station may apply a same or similar interleaver for different system bandwidths. For example, a number of rows of a row-column interleaver may be different for different system bandwidths. In some examples, the base station may apply the interleaver based on a combination of numerology and system bandwidth. For example, for interleaver-enabled numerologies, the interleaver at the base station may be enabled, either implicitly or explicitly, based on the system bandwidth of the base station.

The base station may apply tone-level interleaving or RE-level interleaving based on MCS, TBS, or a combination of MCS and TBS for the PMCH. The interleaver may be enabled for a TBS above a threshold size. The TBS may be related to the number of code blocks per symbol, and therefore, the fraction of the system bandwidth that is experienced by the code blocks of the TBS. The base station may apply a different interleaver for different MCS/TBS combinations, for example, differing in the number of rows of a row-column interleaver. For example, RE-level interleaving may be applied based on a largest MCS and TBS combination. In such an example, a row-column interleaver may use a number of rows corresponding to the largest number of possible code blocks in a PMCH, as determined from the largest possible MCS and TBS combination.

The base station may apply tone-level interleaving or RE-level interleaving based on a reference signal configuration within a PMCH symbol. Different PMCH symbols having the same numerology may have different reference signal patterns or density. The reference signal pattern or density may affect whether or not the interleaver is enabled. The reference signal pattern or density may affect a configuration of the interleaver. Some symbol(s) of the PMCH may have an increased reference signal density, e.g., a density above a threshold. The interleaver may be disabled or not configured for the symbol(s) having a dense RS (for example, above a density threshold). In another example, the interleaver may be configured differently for symbols having an RS density below the threshold than for symbols having an RS density above the threshold. A sparser RS in a PMCH symbol may correspond to a larger number of code blocks. Therefore, interleaving gains may be more pronounced in symbols having a lower RS density. PMCH symbols having denser RS may correspond to a smaller number of code blocks. Interleaving may have less benefit, and may be disabled. As an example of interleaver dependence on a pattern or density of RS in symbol(s), an interleaver may be enabled or configured based on any of a System Frame Number (SFN), a number of PMCH symbols (for example within a 39 ms inter-cell acquisition interval (e.g., between cell acquisition intervals), such as an inter-cell acquisition subframe (inter-CAS) interval), or a PMCH symbol index relative to the previous inter-cell acquisition interval.

An interleaver may be enabled or configured based on any combination of a numerology of the PMCH, a system bandwidth, an MCS, a TBS, a combination of MCS and TBS, a largest MCS and TBS combination, or a reference signal pattern or density, among others. In some examples, the interleaver may apply row-column interleaving based on a largest TBS, and the interleaver may be applied when the PMCH is configured with an RS density above a threshold and with an MCS and TBS combination that meets a threshold. The threshold(s) may be based on a system bandwidth (or bandwidth of an assigned BWP). In an example, the base station can determine the interleaving based on one or more of these various factors (or other factors) and may configure the UE (e.g., in a RRC or other configuration) with parameters or instructions to accordingly de-interleave the channel. In another example, the base station and UE can determine the interleaving/de-interleaving to use based on the factors.

The base station may apply inter-code block interleaving to spread the code blocks across the system bandwidth. The spreading of the code blocks increases the frequency diversity experienced by each code block and may improve accurate reception of the code blocks by UE(s).

As another example, the base station may apply an intra-code block interleaving of the REs corresponding to the individual code blocks. A code block may include systematic bits and parity bits. It may be more important for a UE to receive the systematic bits than the parity bits, and as such, the diversity experienced by the systematic bits may be more important than the diversity experienced by the parity bits. However, within a code block, the systematic bits may experience only a fraction of the system bandwidth. For example, the systematic bits may be mapped so that the systematic bits occupy a fraction r of a system bandwidth with r(<1) corresponding to a coding rate for the PMCH. The coding rate r may correspond to a number of systematic bits divided by the total number of bits of the code block, the total number of bits being the number of systematic bits together with the number of parity bits. The systematic bits may occupy a first r fraction of the REs to which each code block is mapped. An intra-code block interleaving may be applied by the base station to spread the REs of the systematic bits across a code block bandwidth.

The intra-code block interleaver may be applied based on a coding rate of the PMCH. For example, the intra-code block interleaver may be applied for a coding rate below a threshold. The intra-code block interleaver may be applied, configured, or enabled for particular MCS and TBS combinations. The MCS/TBS combinations may include a lower coding rate than other MCS/TBS combinations for which the interleaver is not applied, configured, or enabled.

Intra-code block interleaving may be based on a row-column interleaving. A first row-column interleaver may be used for intra-code block interleaving of a PMCH, and a second row-column interleaver may be used for inter-code block interleaving of the PMCH. A separate row-column interleaver may be applied for intra-code block interleaving each code block. A number of rows in the row-column interleaver may be based on the coding rate of the PMCH. For example, the number of rows may be based on $r \times N_{CB}$, where $N_{CB}$ is the number of tones per code block. The example matrix 600 for row-column interleaving a code block in FIG. 6 shows that, for a coding rate of r, the row-column interleaving will map the systematic bits of the code blocks 602, 604, 606, and 608 to a fraction of the system bandwidth. For example, the systematic bits will be mapped to a first portion of the system bandwidth based on the coding rate r. In order to increase the frequency diversity of the systematic bits of the code blocks 602, 604, 606, and 608, an additional intra-CB interleaving of the tone indices may be applied prior to the inter-code-block row-column interleaving, described in connection with FIGS. 6 and 7.

The intra-code-block row-column interleaving may include writing indices for the REs corresponding to the bits of the code block to a matrix in a row-wise manner and then reading the indices from the matrix in a column-wise manner to obtain the interleaved RE indices. As described above, in some examples, the number of rows of the matrix may be based on the coding rate of the PMCH. As another example, the indices may be written to the matrix in a column-wise manner and the indices may then be read from the matrix in a row-wise manner to obtain the interleaved indices.

In some examples, the base station may apply inter-code-block interleaving to the REs after intra-code block interleaving is performed.

The interleaver(s) may be specified for particular PMCH configurations. For example, if a particular PMCH configuration is applied, the base station may apply the corresponding interleaver. A particular interleaver configuration may have a relationship to a particular PMCH configuration (such as a PMCH numerology, a TBS and MCS entry for the PMCH, a reference signal pattern for the PMCH, among other examples). The base station may use a look-up table to determine whether interleaving should be applied or not applied (for example, enabled/disabled) for a particular PMCH configuration. The base station may use the look-up table to determine an interleaving pattern or interleaving configuration based on a particular PMCH configuration. The look-up table may include an entry for each of the possible PMCH configurations. The look-up table may include entries for a subset of the possible PMCH configurations. In one example, a UE may use a similar look-up table (which may be configured by the base station or otherwise stored in memory of the UE) to determine whether an interleaving pattern is used by the base station for the PMCH. In another example, the UE may receive an indication, from the base station, as to whether interleaving is performed and/or the parameters for the interleaving that can be used to de-interleave the PMCH.

In another example, one or more interleaving patterns may be supported for a particular PMCH configuration. The interleaving patterns may include at least one of an intra-code-block interleaving pattern or an inter-code-block interleaving pattern. The base station may signal or indicate, to UE(s) receiving the PMCH, a particular interleaving pattern from among the possible interleaving patterns/configurations. The base station may signal that the interleaver is enabled/disabled. The UE may use the indication(s) from the base station to determine whether interleaving is applied, and if so, which interleaving pattern is applied. The UE may use the interleaving pattern to de-interleave the received PMCH. The interleaving pattern or indication of disabling/enabling the interleaving pattern may be signaled in system information (such as in SIB). Additionally or alternatively, the interleaving pattern or indication of disabling/enabling the interleaving pattern may be signaled in the MCCH. As an example, the SIB may indicate whether interleaving is applied, and if so, an interleaving pattern, for the MCCH transmission from the base station. The UE may receive the MCCH transmission using the indication(s) about interleaving in the SIB. The MCCH transmission may include an indication about whether interleaving is applied, and if so, an interleaving pattern, for the MTCH transmission from the base station. The UE may then receive the MTCH transmission using the indication(s) about interleaving in the MCCH.

A row-column interleaving, as described in connection with FIGS. 6 and 7 may lead to elements from a given codeblock being spaced apart in frequency by a constant period. For example, interleaving using an interleaving structure having C rows would lead to a period based on C when the elements are written row-by-row and read out column-by-column. In some channel conditions, the periodic spacing of the elements of a code block may experience periodic fading in the frequency domain. Therefore, the periodic fading may disproportionately affect a given code block. In one example described herein, to reduce the effect of periodic fading impacting a given code block, the elements of each column may be cyclically shifted according to a cyclic shift value when performing row-column interleaving before the elements are read out in a column-by-column pattern. Each column may have a different applied cyclic shift value, such that the cyclic shift value depends on the column index. The cyclic shift value may be determined in a pseudo-random manner so that elements of a code block have a reduced adverse effect due to periodic fading. When the cyclic shifts are applied in a pseudo-random manner across the columns, the periodic spacing of code block elements in the read out of the columns is avoided.

Figure 14:
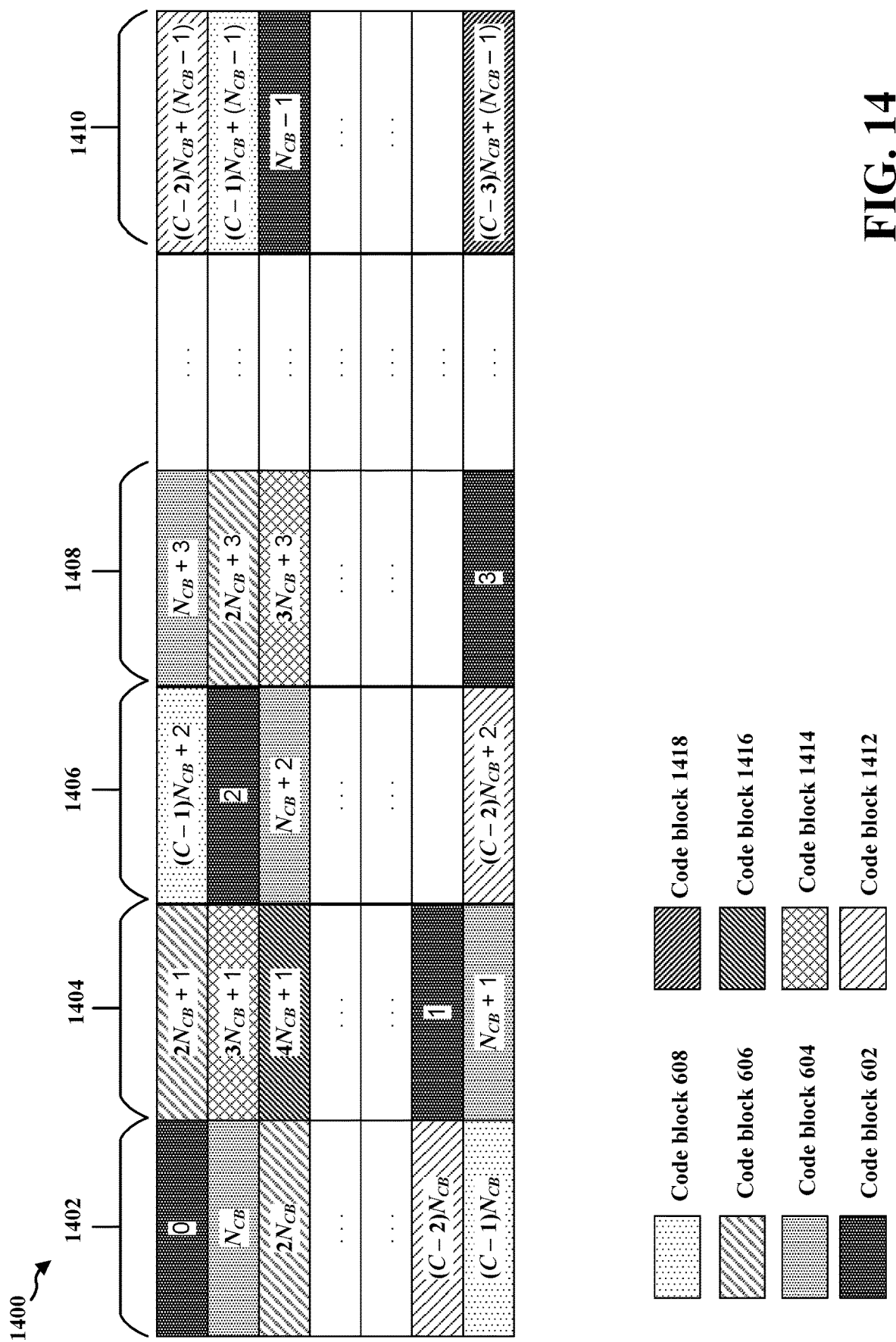
FIG. 14 is an example of a matrix for row-column interleaving of code blocks that includes a cyclic shift applied to each of the columns in accordance with some aspects of the presented disclosure.

FIG. 14 is an example of a matrix 1400 for row-column interleaving of code blocks that includes a cyclic shift applied to each of the columns in accordance with some aspects of the presented disclosure. The elements of the matrix 1400 in FIG. 14 correspond to the elements of the matrix 600 in FIG. 6 with additional shown code blocks 1412, 1414, 1416, 1418 for the purpose of illustrating this example. After the elements of the code blocks are written into the matrix using the row-wise pattern described in connection with FIG. 6, the elements of each column are cyclically shifted. For example, in FIG. 14, column 1402, which corresponds to column 602 from FIG. 6, has an applied cyclic shift of 0 so that the elements have not been shifted. Column 1404, which corresponds to column 604 from FIG. 6, has an applied cyclic shift of C−2 so that the first element (1) has been shifted within the column by −2. Column 1406, which corresponds to column 606 from FIG. 6, has an applied cyclic shift of 1 so that the first element (2) has been shifted within the column by +1. Column 1408, which corresponds to column 608 from FIG. 6, has an applied cyclic shift of C−1 so that the first element (3) has been shifted within the column by −1. Column 1410, which corresponds to column 610 from FIG. 6, has an applied cyclic shift of 2 so that the first element ($N_{CB}$−1) has been shifted within the column by +2. After the cyclic shift is applied, the transmitter in this example, can read out the elements from the matrix 1400 column-by-column, as described in connection with FIGS. 6 and 7. Although the example for cyclic shifting has been described for cyclically shifting the elements within a column, the cyclic shift may alternatively or additionally be applied to elements within each row of the interleaving structure.

A random or pseudo-random generation of the cyclic shift value for each column may help to protect the elements of a particular code block from adverse impact due to periodic fades. In some examples, the cyclic shift may be determined using a pseudo-random number generator. The pseudo-random number generator may be initialized with a particular value. The initialization value may be based on an area ID, such as a multicast and broad cast area identifier (e.g., a MBSFN area ID).

In some examples, the pseudo-random number generator may generate a number for each column index. For example, the number for each column index may be generated based on the column index value, the multicast or broadcast area ID, or a combination of both values.

In order to reduce the amount of times the pseudo-random number generator generates a number, the pseudo-random number generator may generate a single number having multiple digits or bit positions. The cyclic shift for each column may be based on a respective portion of the generated number. For example, for a number of columns that equal $N_{col}$, the pseudo-random number generator may generate a number having a length of 8 $N_{col}$ bits. The cyclic shift for each column may be based on a group of 8 bits from the number. For example, bits b0-b7 may represent the cyclic shift for a first column, bits b8-b15 may represent the cyclic shift for the second column, and so forth.

In the above examples, the UE can similarly determine the cyclic shift value for each column to de-interleave the code blocks. In an example, the UE can generate the same pseudo-random number as the base station (e.g., for all columns or each column) based on the column index value, multicast or broadcast area ID, etc. In another example, the base station can configure the UE with the pseudo-random number used (e.g., for all columns or each column), and the UE can determine the cyclic shift based on the configured pseudo-random number, etc.

Figure 8:
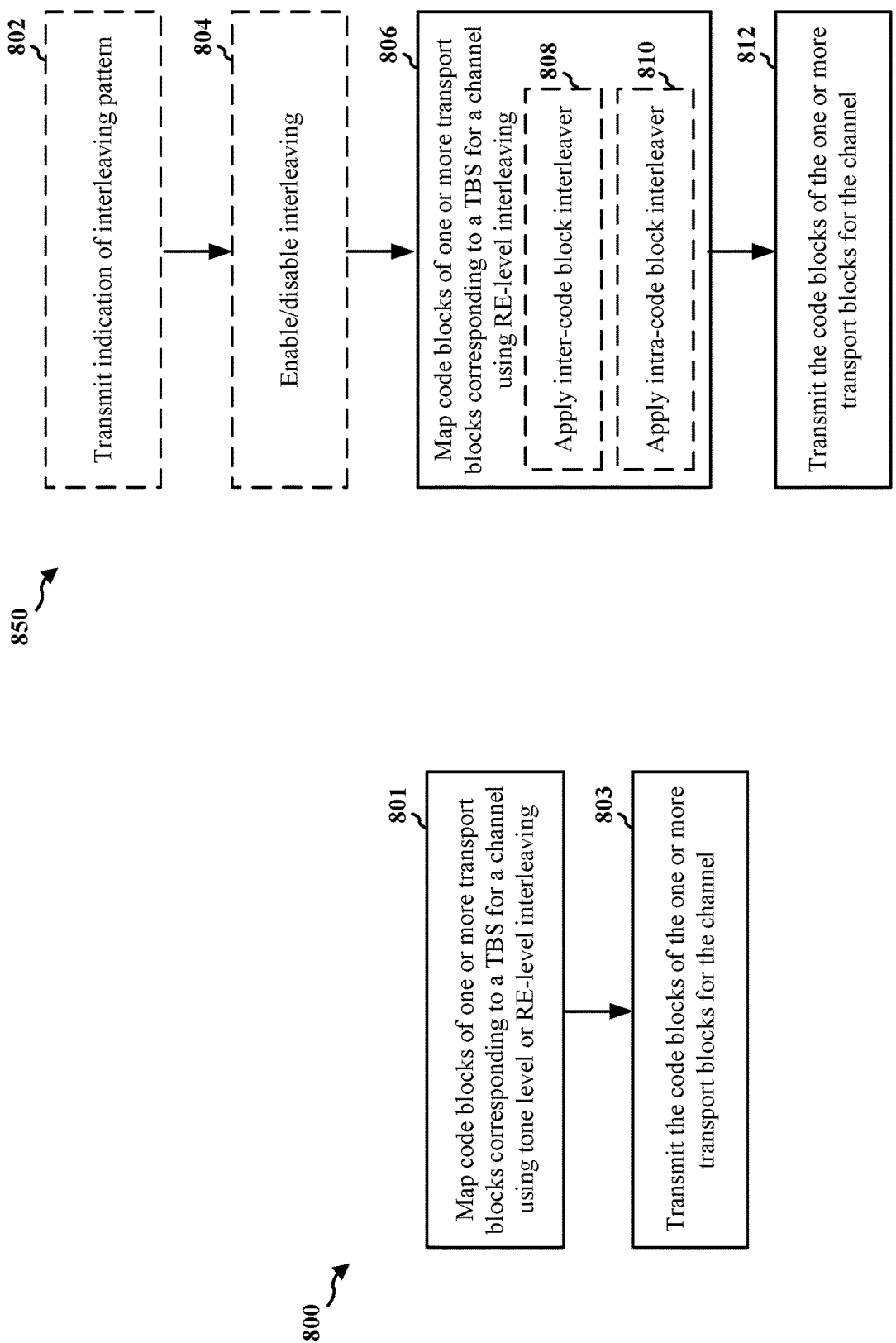
FIG. 8A is a flowchart of a method of wireless communication including tone level or resource element (RE)-level interleaving of code blocks for a channel in accordance with some aspects of the presented disclosure.
FIG. 8B is a flowchart of a method of wireless communication including tone level or resource element (RE)-level interleaving of code blocks for a channel in accordance with some aspects of the presented disclosure.

FIG. 8A is a flowchart 800 of a method of wireless communication including tone level or RE-level interleaving for code blocks of a channel. The method may be performed by a base station or a component of a base station (for example, the base station 102, 180, 310, 412, or 414; the apparatus 902; the processing system 1014, which may include the memory 376 and which may be the entire base station 310 or a component of the base station 310, such as at least one of the TX processor 316, the RX processor 370, or the controller/processor 375). Optional aspects are illustrated with a dashed line. The method may improve channel performance by increasing the frequency diversity of code blocks within the channel or by increasing the frequency diversity of systematic bits within a code block.

At 801, the base station maps code blocks of one or more transport blocks corresponding to a TBS for a channel using tone-level interleaving or RE-level interleaving. The tone-level or RE-level interleaving may include row-column interleaving, as described in connection with FIGS. 6 and 7. As an example, the interleaver component 908 of the apparatus 902 may perform the mapping.

At 803, the base station transmits the code blocks of the one or more transport blocks for the channel. The base station may transmit the channel (e.g., PMCH) using aspects described, for example, in connection with FIGS. 4A-4C. The transmission may be performed, for example, by the transmission component 906 of the apparatus 902 in FIG. 9.

FIG. 8B is a flowchart 850 of a method of wireless communication including tone-level interleaving or RE-level interleaving for code blocks of a channel. The method may be performed by a base station or a component of a base station (for example, the base station 102, 180, 310, 412, or 414; the apparatus 902; the processing system 1014, which may include the memory 376 and which may be the entire base station 310 or a component of the base station 310, such as at least one of the TX processor 316, the RX processor 370, or the controller/processor 375). Optional aspects are illustrated with a dashed line. The method may improve channel performance by increasing the frequency diversity of code blocks within the channel or by increasing the frequency diversity of systematic bits within a code block.

At 806, the base station maps code blocks of one or more transport blocks corresponding to a transport block size for a channel using tone-level interleaving or RE-level interleaving. The tone-level interleaving or RE-level interleaving may include row-column interleaving, as described in connection with FIGS. 6 and 7. As an example, the interleaver component 908 of the apparatus 902 may perform the mapping. In some examples, the base station may apply a cyclic shift with the tone-level interleaving or the RE-level interleaving, as described in connection with FIG. 14. For example, the cyclic shift may be applied to each column of an interleaving structure. In some aspects, the base station may generate a random number to determine the cyclic shift for each column of the interleaving structure. A random number generator that generates the random number for the cyclic shift value for each column may be initialized, at least in part, with a multicast or broadcast area identifier corresponding to a broadcast transmission, such as the broadcast transmission that includes the code blocks. For example, the transmission may comprise a PMCH transmission. Each set of PMCH symbols may be associated with a multicast or broadcast area identifier. For example, the multicast or broadcast area identifier may that identify the broadcast/multicast data service that is transmitted by the set of PMCH symbols. In some aspects, the base station may generate a random number, where the cyclic shift for each column of the interleaving structure is based on a respective portion of the random number. A random number generator that generates the random number may be initialized based, at least in part, with a multicast or broadcast area identifier corresponding to a broadcast transmission. Although the example for cyclic shifting has been described for cyclically shifting the elements within a column, the cyclic shift may alternatively or additionally be applied to elements within each row of the interleaving structure.

The tone-level interleaving or RE-level interleaving may include inter-code block interleaving, as illustrated at 808. For inter-code block interleaving, a number of rows or a number of columns in the row-column interleaving may be based on a number of code blocks in one or more transport blocks corresponding to the TBS. If the indices are written (in memory) along a row and read (from memory) along a column, the number of rows may be based on the number of code blocks in one or more transport blocks corresponding to the TBS. Similarly, if the interleaving includes writing the indices along a column and reading the indices along a row, the number of columns may be based on the number of code blocks in one or more transport blocks corresponding to the TBS. In another example, the number of rows or a number of columns in the row-column interleaving is based on a largest number of code blocks in a PMCH symbol for a largest MCS and TBS entry. In some examples, Nil elements may be used for the mapping.

The mapping of the code blocks using RE-level interleaving may include interleaving the code blocks using sets of contiguous REs or PRBs as a base unit of the RE-level interleaving. The sets of contiguous REs may include a single RE. Thus, the mapping of the code blocks using the RE-level interleaving includes interleaving the code blocks that may use single REs as a base unit of the RE-level interleaving.

The tone-level interleaving or the RE-level interleaving may be applied based on a numerology for the PMCH. Interleaving may be applied for some numerologies and may not be applied for other numerologies. For example, the base station may apply the tone-level interleaving or the RE-level interleaving for numerologies having a longer CP or a larger TBS than the other numerologies. The numerology for the PMCH may include at least one of a cyclic prefix duration, a useful symbol duration, or a subcarrier spacing of a PMCH symbol.

The tone-level interleaving or the RE-level interleaving may be applied based on a system bandwidth. For example, tone-level interleaving or the RE-level interleaving may be applied for system bandwidths above a threshold and may not be applied when a system bandwidth is less than the threshold. In another example, a different interleaver may be applied for different bandwidths.

The tone-level interleaving or the RE-level interleaving may be applied based on one or both of a MCS or the TBS. As an example, the tone-level interleaving or the RE-level interleaving may be applied for a TBS above a threshold size and may not be applied for a TBS below the threshold size.

The tone-level interleaving or the RE-level interleaving may be applied based on a reference signal pattern or a reference signal density for the PMCH. As an example, the tone-level interleaving or the RE-level interleaving may be applied for a PMCH having a reference signal density below a threshold and may not be applied for a PMCH having a reference signal density above the threshold. The tone-level interleaving or the RE-level interleaving may be applied based on at least one of a system frame number, a number of PMCH symbols within an inter-cell acquisition subframe interval, or a PMCH symbol index following a preceding cell acquisition subframe.

The tone-level interleaving or the RE-level interleaving may be applied based on a combination of multiple factors including a combination of any of a largest TBS, a reference signal density, a reference signal pattern, a combination of a modulation and coding scheme (MCS) and the TBS, or a system bandwidth.

The tone-level interleaving or the RE-level interleaving may include inter-code block interleaving, as illustrated at 808. The tone-level interleaving or the RE-level interleaving may further include intra-code block interleaving, as illustrated at 810. For example, each code block may include systematic bits and parity bits, and the intra-code block interleaving may spread the systematic bits across a code block bandwidth. The intra-code block interleaving may be applied, at 810, based on a coding rate of the PMCH being below a threshold. The intra-code block interleaving may be applied, at 810, based on a combination of an MCS and the TBS. The intra-code block interleaving, at 810, may include a row-column interleaving, as described in connection with FIGS. 6 and 7. The row-column interleaving may use a number of rows or a number of columns that is based on a coding rate of the PMCH. If the indices are written along a row and read along a column, the number of rows may be based on the coding rate of the PMCH. Similarly, if the interleaving includes writing the indices along a column and reading the indices along a row, the number of columns may be based on the coding rate of the PMCH.

Specifications of the RE-level interleaving may be based on a relationship to a configuration of the PMCH.

At 812, the base station transmits the code blocks of the one or more transport blocks for the channel. The base station may transmit the channel (e.g., PMCH) using aspects described, for example, in connection with FIGS. 4A-4C. The transmission may be performed, for example, by the transmission component 906 of the apparatus 902 in FIG. 9.

At 802, the base station may transmit an indication of an interleaving pattern used for the tone-level interleaving or the RE-level interleaving of the code blocks of the channel. The patterns may be from among a set of interleaving patterns. For example, the base station may indicate particular interleaving patterns from a set of interleaving patterns for the channel. The set of interleaving patterns may have a corresponding table, and the base station may indicate an entry in the table in order to indicate the interleaving pattern. In another example, the indication may additionally or alternatively include one or more parameters for determining the interleaving pattern, such as numerologies, TBSs, MCSs, RS densities, bandwidths or BWPs, etc. that may use the interleaving pattern, parameters for the interleaving pattern (e.g., number of rows or columns in the table), pseudo-random number or parameters for determining the pseudo-random number used for cyclically shifting one or more columns, and/or the like. The indication may be transmitted, for example, by the interleaver pattern component 914 of the apparatus 902 via the transmission component 906.

At 804, the base station may enable or disable the tone-level interleaving or the RE-level interleaving for the channel. The base station may signal to the UE whether the tone-level interleaving or the RE-level interleaving is enabled/disabled. The enabling/disabling, such as indicating to the UE whether the interleaving is enabled/disabled, may be performed by the enable component 916 of the apparatus 902 in FIG. 9.

The indication(s) at 802 or 804 may be transmitted in at least one of system information or a multicast control channel. The indication(s) may be transmitted in a SIB. The indication(s) may be transmitted in a MCCH. The indication(s) may be transmitted in a SIB and in a MCCH. As an example, a first interleaving indication for a multicast control channel mapped PMCH may be conveyed in system information, and a second interleaving indication for a multicast transport channel mapped PMCH may be conveyed in the multicast transport channel mapped PMCH.

Figure 9:
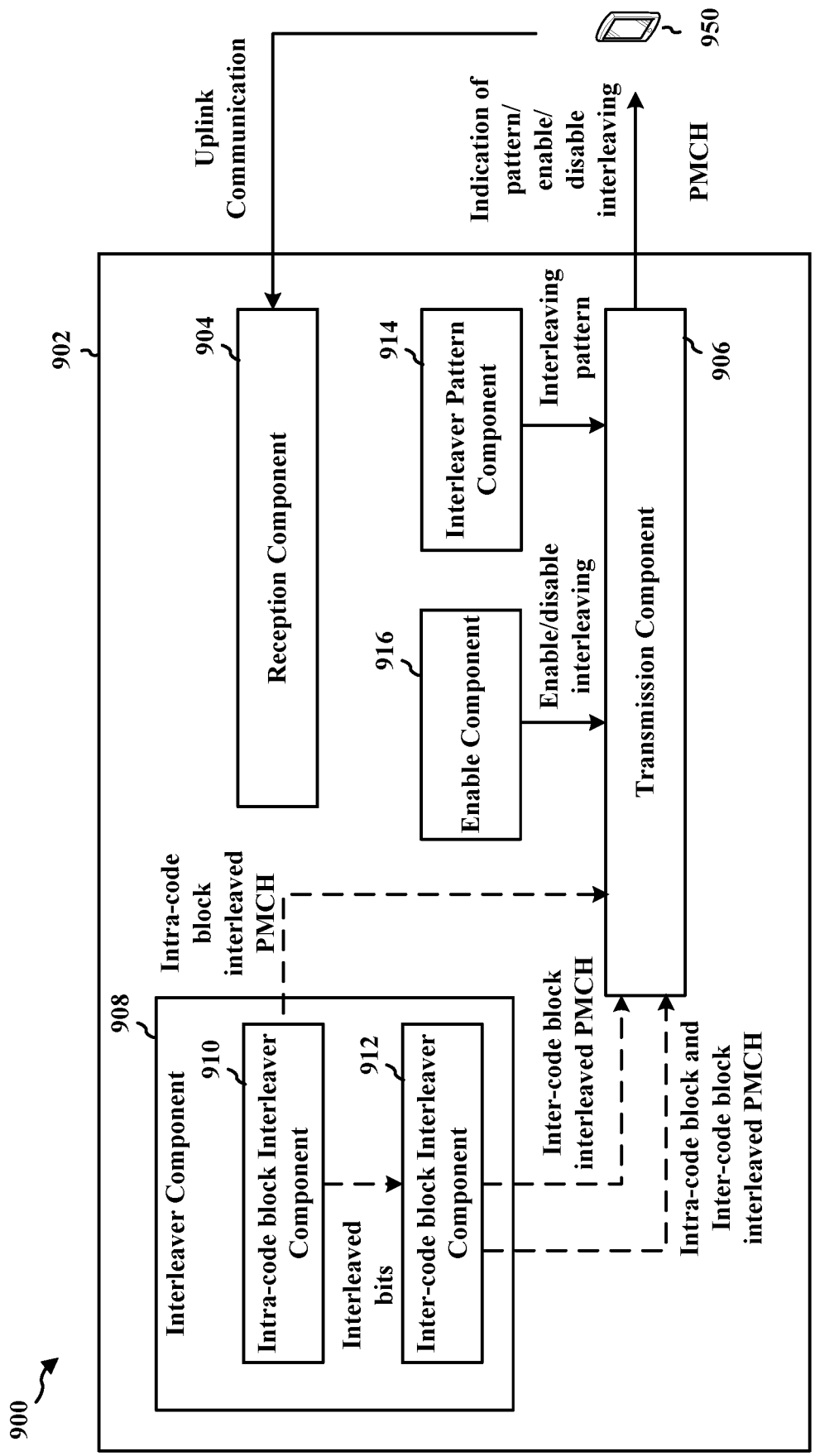
FIG. 9 is a conceptual data flow diagram illustrating the data flow between different means/components in an example apparatus in accordance with some aspects of the presented disclosure.

FIG. 9 is a conceptual data flow diagram 900 illustrating the data flow between different means/components in an example apparatus 902. The apparatus may be a base station or a component of a base station, such as the base station 102, 180, 310, 412, or 414. The apparatus includes a reception component 904 configured to receive uplink communication from one or more UEs 950. The apparatus includes interleaver component 908 configured to map code blocks of one or more transport blocks corresponding to a TBS for a channel using tone-level interleaving or RE-level interleaving, such as described in connection with 801 in FIG. 8A or 806 in FIG. 8B. The transmission component 906 of the apparatus 902 may be configured to transmit the code blocks of one or more transport blocks corresponding to the TBS for the channel, such as described in connection with 803 in FIG. 8A or 812 in FIG. 8B. The interleaver component 908 may include an intra-code block interleaver component 910 configured to apply an intra-code block interleaving to the bits of a code block. The interleaver component 908 may include an inter-code block interleaver component 912 configured to apply an inter-code block interleaving to the tones of the code blocks. The apparatus 902 may include an interleaver pattern component 914 configured to transmit via the transmission component 906 an indication of an interleaving pattern used for the tone-level interleaving or the RE-level interleaving of the code blocks of the channel, such as described in connection with 802 in FIG. 8B. The apparatus 902 may include an enable component 916 configured to enable/disable the tone-level interleaving or the RE-level interleaving for the channel, such as by sending an indication to the UE that the tone-level interleaving or the RE-level interleaving is enabled/disabled, such as described in connection with 804 in FIG. 8B.

The apparatus may include additional components that perform each of the blocks of the algorithm in the aforementioned flowcharts of FIGS. 8A and 8B. As such, each block in the aforementioned flowcharts of FIGS. 8A and 8B may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 10:
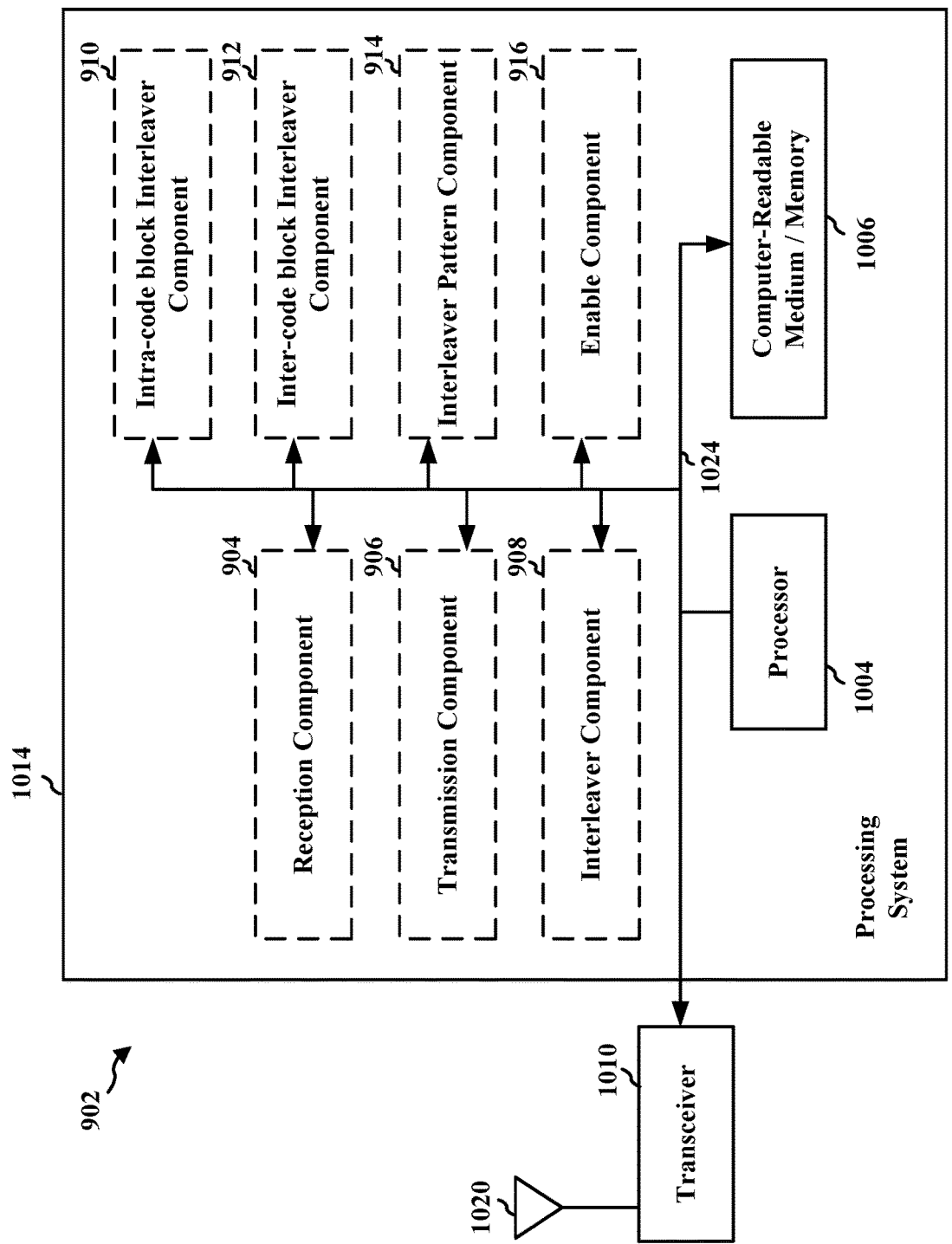
FIG. 10 is a diagram illustrating an example of a hardware implementation for an apparatus employing a processing system in accordance with some aspects of the presented disclosure.

FIG. 10 is a diagram illustrating an example of a hardware implementation for an apparatus 902 employing a processing system 1014. The processing system 1014 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors or hardware components, represented by the processor 1004, the components 904, 906, 908, 910, 912, 914, 916, and the computer-readable medium/memory 1006. The bus 1024 may also link various other circuits such as timing sources, peripherals, voltage regulators, and power management circuits, which are known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The transceiver 1010 receives a signal from the one or more antennas 1020, extracts information from the received signal, and provides the extracted information to the processing system 1014, specifically the reception component 904. In addition, the transceiver 1010 receives information from the processing system 1014, specifically the transmission component 906, and based on the received information, generates a signal to be applied to the one or more antennas 1020. The processing system 1014 includes a processor 1004 coupled to a computer-readable medium/memory 1006. The processor 1004 is responsible for general processing, including the execution of software stored on the computer-readable medium/memory 1006. The software, when executed by the processor 1004, causes the processing system 1014 to perform the various functions described supra for any particular apparatus. The computer-readable medium/memory 1006 may also be used for storing data that is manipulated by the processor 1004 when executing software. The processing system 1014 further includes at least one of the components 904, 906, 908, 910, 912, 914, 916. The components may be software components running in the processor 1004, resident/stored in the computer readable medium/memory 1006, one or more hardware components coupled to the processor 1004, or some combination thereof. The processing system 1014 may be a component of the base station 310 and may include the memory 376 or at least one of the TX processor 316, the RX processor 370, and the controller/processor 375. Alternatively, the processing system 1014 may be the entire base station (for example, see 310 of FIG. 3).

In one configuration, the apparatus 902 for wireless communication includes means for mapping code blocks of one or more transport blocks corresponding to a TBS for a channel using tone-level interleaving or RE-level interleaving. The means for mapping the code blocks may apply an intra-code block interleaving. The means for mapping the code blocks may apply an inter-code block interleaving. The apparatus 902 may include means for transmitting the code blocks of one or more transport blocks corresponding to the TBS for the channel. The apparatus 902 may include means for transmitting an indication of an interleaving pattern used for the tone-level interleaving or the RE-level interleaving of the code blocks of the channel. The apparatus 902 may include means for enabling or disabling the tone-level interleaving or the RE-level interleaving for the channel. The aforementioned means may be one or more of the aforementioned components of the apparatus 902 or the processing system 1014 of the apparatus 902 configured to perform the functions recited by the aforementioned means. As described supra, the processing system 1014 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 11:
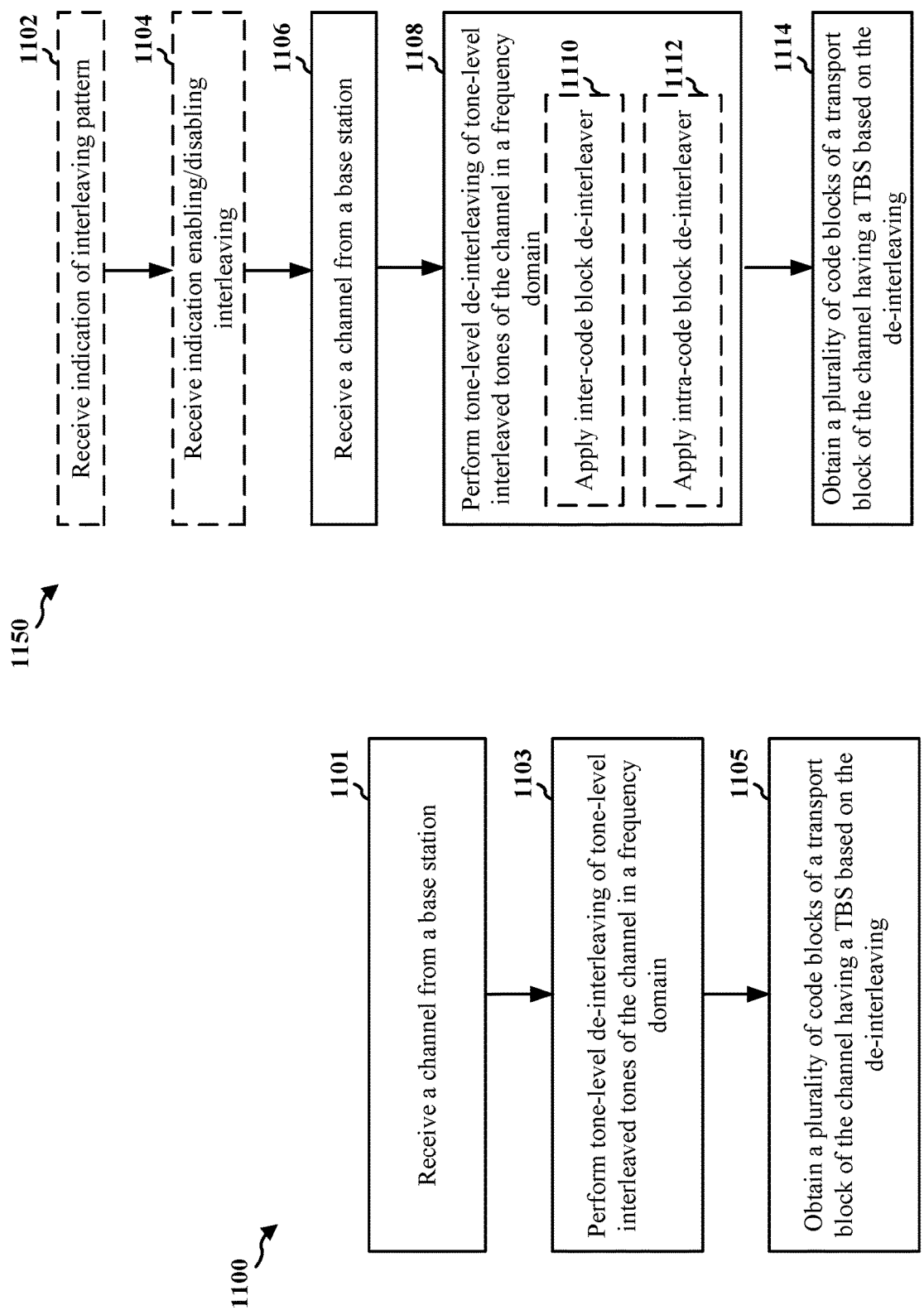
FIG. 11A is a flowchart of a method of wireless communication including receiving a channel having tone-level or RE-level interleaved code blocks in accordance with some aspects of the presented disclosure.
FIG. 11B is a flowchart of a method of wireless communication including receiving a channel having tone-level or RE-level interleaved code blocks in accordance with some aspects of the presented disclosure.

FIG. 11A is a flowchart 1100 of a method of wireless communication. The method may be performed by a UE or a component of UE (for example, the UE 104, 350, or 420; the apparatus 1202; the processing system 1314, which may include the memory 360 and which may be the entire UE 350 or a component of the UE 350, such as at least one of the TX processor 368, the RX processor 356, or the controller/processor 359). Optional aspects are illustrated with a dashed line. The method may improve channel reception through increased frequency diversity of code blocks within the channel or by increased the frequency diversity of systematic bits within a code block.

At 1101, the UE receives a channel from a base station. The UE may receive the channel using aspects described, for example, in connection with FIGS. 4A-4C. The reception may be performed, for example, by the reception component 1206 of the apparatus 1202 in FIG. 12.

At 1103, the UE performs tone-level de-interleaving of tone-level interleaved tones of the channel in a frequency domain. The tones may be interleaved by the base station using tone level or RE-level interleaving, e.g., as described in connection with FIGS. 6-8. Thus, the UE may use a corresponding configuration or pattern to de-interleave the tones of the received channel (e.g., PMCH). The UE can perform the tone-level de-interleaving in order to obtain the code blocks of a one or more transport blocks corresponding to a TBS for the channel. The de-interleaving may be performed, for example, by the de-interleaver component 1208 of the apparatus 1202.

At 1105, the UE obtains a plurality of code blocks of a transport block of the channel having a TBS based on the de-interleaving. The UE can perform the tone-level de-interleaving similarly as the tone-level interleaving, such as by using a reverse process to map the received tones in a table column-wise, and then store the code blocks by obtaining the tones from the table row-wise in order to obtain the code blocks of a one or more transport blocks corresponding to a TBS for the channel. Obtaining the plurality of code blocks may be performed, for example, by the de-interleaver component 1208 of the apparatus 1202.

FIG. 11B is a flowchart 1150 of a method of wireless communication. The method may be performed by a UE or a component of UE (for example, the UE 104, 350, or 420; the apparatus 1202; the processing system 1314, which may include the memory 360 and which may be the entire UE 350 or a component of the UE 350, such as at least one of the TX processor 368, the RX processor 356, or the controller/processor 359). Optional aspects are illustrated with a dashed line. The method may improve channel reception through increased frequency diversity of code blocks within the channel or by increased the frequency diversity of systematic bits within a code block.

At 1106, the UE receives a channel from a base station. The UE may receive the channel using aspects described, for example, in connection with FIGS. 4A-4C. The reception may be performed, for example, by the reception component 1206 of the apparatus 1202 in FIG. 12.

At 1108, the UE performs tone-level de-interleaving of tone-level interleaved tones of the channel in a frequency domain. The tones may be interleaved by the base station using tone level or RE-level interleaving, e.g., as described in connection with FIGS. 6-8. Thus, the UE may use a corresponding configuration or pattern to de-interleave the tones of the received channel (e.g., PMCH). The UE can perform the tone-level de-interleaving in order to obtain the code blocks of a one or more transport blocks corresponding to a TBS for the channel. The de-interleaving may be performed, for example, by the de-interleaver component 1208 of the apparatus 1202.

The tone-level interleaving or the RE-level interleaving may include row-column interleaving, as described in connection with FIGS. 6 and 7. Therefore, the UE may apply a corresponding de-interleaving based on an interleaving pattern used to interleave the code blocks of the channel.

In some examples, the base station may have applied a cyclic shift with the tone-level interleaving or the RE-level interleaving, as described in connection with FIG. 14. For example, the cyclic shift may have been applied to each column of an interleaving structure. In some aspects, the UE may generate a random number to determine the cyclic shift for each column of the interleaving structure in order to de-interleave the received tones. A random number generator that generates the random number for the cyclic shift value for each column may be initialized, at least in part, with a multicast or broadcast area identifier corresponding to a broadcast transmission, such as the broadcast transmission that includes the code blocks. In some aspects, the UE may generate a random number, where the cyclic shift for each column of the interleaving structure is based on a respective portion of the random number. A random number generator that generates the random number may be initialized based, at least in part, with a multicast or broadcast area identifier corresponding to a broadcast transmission. In another example, the UE may receive, from the base station, an indication of the random number to determine the cyclic shift, and may accordingly determine the code blocks as cyclically shifted. Although the example for cyclic shifting has been described for cyclically shifting the elements within a column, the cyclic shift may similarly be applied to elements within each row of the interleaving structure.

The tone-level interleaving or the RE-level interleaving may include inter-code block interleaving. Thus, the UE may apply an inter-code block de-interleaving, at 1110. A number of rows or a number of columns in the row-column interleaving may be based on a number of code blocks in one or more transport blocks corresponding to the TBS. A number of rows or a number of columns in the row-column interleaving may be based on a largest number of code blocks in a PMCH symbol for a largest MCS and TBS entry. The code blocks may be interleaved using sets of contiguous REs or as a base unit of the tone-level interleaving or the RE-level interleaving. The code blocks may be interleaved using single REs as a base unit of the tone-level interleaving or the RE-level interleaving. The code blocks may be interleaved based on at least one of a numerology for the PMCH, a system bandwidth, a modulation and coding scheme (MCS), the TBS, a combination of the MCS and the TBS, a largest TBS, a reference signal pattern for the PMCH, a reference signal density for the PMCH, a system frame number, a number of PMCH symbols within an inter-cell acquisition subframe interval, a PMCH symbol index following a preceding cell acquisition subframe, or a coding rate of the PMCH being below a threshold.

The tone-level interleaving or the RE-level interleaving may include intra-code block interleaving. Thus, the UE may apply an intra-code block de-interleaving, at 1112. Each code block of the PMCH may include systematic bits and parity bits. The systematic bits may be spread across a code block bandwidth based on the intra-code block interleaving. The intra-code block interleaving may include a row-column interleaving using a number of rows or a number of columns that is based on a coding rate of the PMCH. The tone-level interleaving or the RE-level interleaving may further include inter-code block interleaving.

Configurations or specifications of the tone-level interleaving or the RE-level interleaving may be based on a relationship to a configuration of the PMCH.

At 1114, the UE obtains a plurality of code blocks of a transport block of the channel having a TBS based on the de-interleaving. The UE can perform the tone-level de-interleaving similarly as the tone-level interleaving, such as by using a reverse process to map the received tones in a table column-wise, and then store the code blocks by obtaining the tones from the table row-wise in order to obtain the code blocks of a one or more transport blocks corresponding to a TBS for the channel. Obtaining the plurality of code blocks may be performed, for example, by the de-interleaver component 1208 of the apparatus 1202.

As illustrated at 1102, the UE may receive an indication of an interleaving pattern used for the tone-level interleaving or the RE-level interleaving of the code blocks of the channel. The UE may use the indicated interleaving pattern to perform the de-interleaving at 1108. The indication may enable the tone-level interleaving or the RE-level interleaving for the channel. The patterns may be from among a set of interleaving patterns. For example, the UE may receive an indicate or a particular interleaving pattern from a set of interleaving patterns for channel. The set of interleaving patterns may have a corresponding table, and the base station may indicate an entry in the table in order to indicate the interleaving pattern. In another example, the indication may additionally or alternatively include one or more parameters for determining the interleaving pattern, such as numerologies, TBSs, MCSs, RS densities, bandwidths or BWPs, etc. that may use the interleaving pattern, parameters for the interleaving pattern (e.g., number of rows or columns in the table), pseudo-random number or parameters for determining the pseudo-random number used for cyclically shifting one or more columns, and/or the like. The UE may accordingly determine the interleaving pattern and/or cyclic shifting of the columns based on the indication. The indication may be received, for example, by the interleaver pattern component 1214 of the apparatus 1202 via the reception component 1204.

The UE may receive an indication enabling/disabling the interleaving for a channel. The indication enabling/disabling may be received by the enable component 1216 of the apparatus 1202 in FIG. 12 via the reception component 1204.

The indication(s) at 1102 or 1104 may be received in at least one of system information or a multicast control channel. The indication(s) may be received in a SIB. The indication(s) may be received in a MCCH. The indication(s) may be received in a SIB and in a MCCH. As an example, a first interleaving indication for a multicast control channel mapped PMCH may be conveyed in system information, and a second interleaving indication for a multicast transport channel mapped PMCH may be conveyed in the multicast transport channel mapped PMCH.

Figure 12:
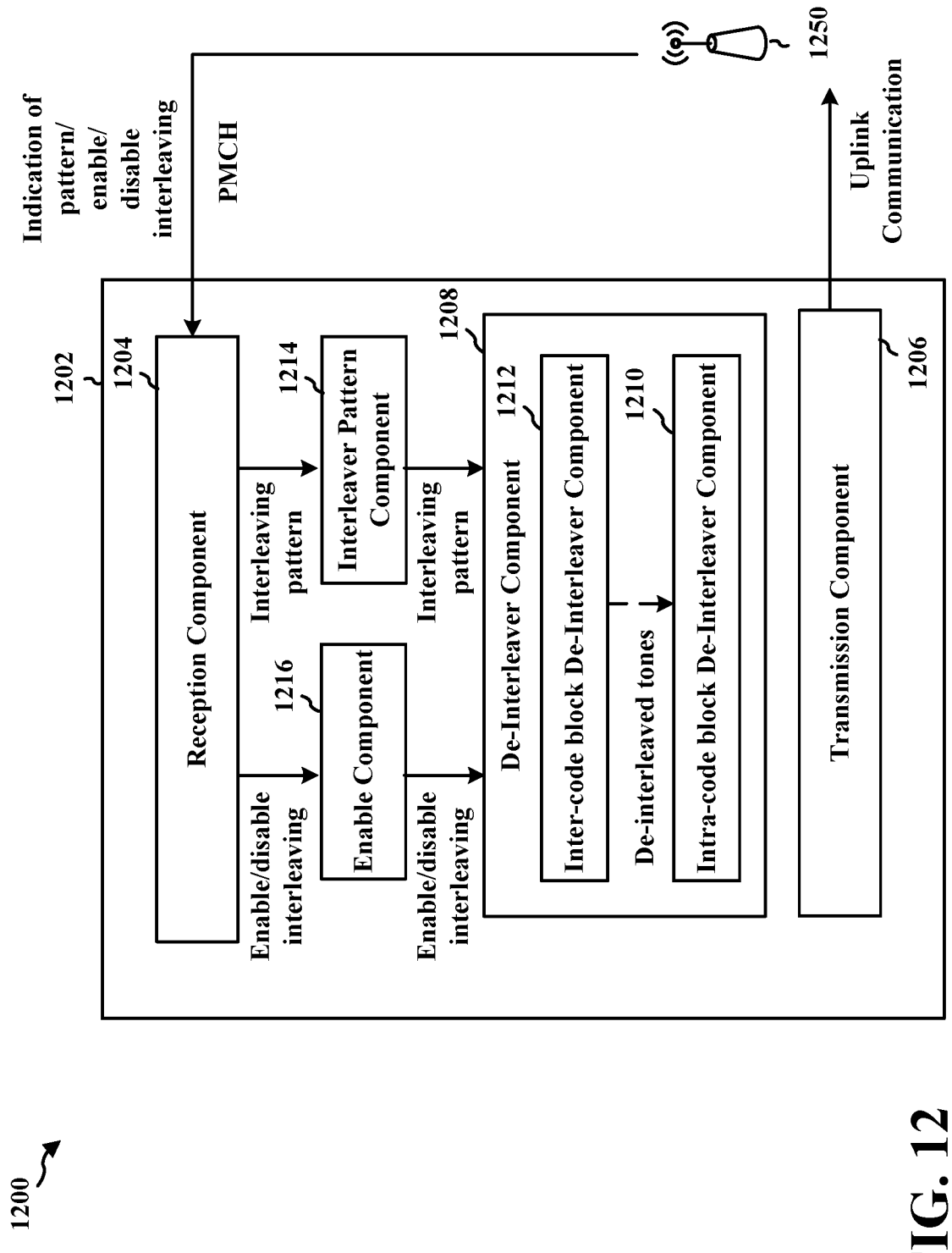
FIG. 12 is a conceptual data flow diagram illustrating the data flow between different means/components in an example apparatus in accordance with some aspects of the presented disclosure.

FIG. 12 is a conceptual data flow diagram 1200 illustrating the data flow between different means/components in an example apparatus 1202. The apparatus may be a UE or a component of a UE The apparatus includes a reception component 1204 that receives downlink communication from a base station 1250, such as a PMCH. The apparatus includes a transmission component that transmits uplink communication to the base station 1250. Reception component 1204 may be configured to receive a PMCH or other channel from a base station. The apparatus 1202 may include a de-interleaver component 1208 configured to de-interleave received tones of the channel in a frequency domain to obtain code blocks of one or more transport blocks corresponding to a TBS for the channel, as described in connection with 1108, the code blocks being interleaved using tone-level interleaving or the RE-level interleaving. The tone-level interleaving or the RE-level interleaving may include inter-code block interleaving. Therefore, the de-interleaver component 1208 may include an inter-code block de-interleaver component 1212 configured to de-interleave the channel using inter-code block de-interleaving. The tone-level interleaving or the RE-level interleaving may include intra-code block interleaving. Therefore, the de-interleaver component 1208 may include an intra-code block de-interleaver component 1210 configured to de-interleave the channel using intra-code block de-interleaving. The apparatus 1202 may include an interleaver pattern component 1214 configured to receive an indication of an interleaving pattern used for the tone-level interleaving or the RE-level interleaving of the code blocks of the channel. The apparatus 1202 may include an enable component 1216 configured to receive an indication enables the tone-level interleaving or the RE-level interleaving for the channel.

The apparatus may include additional components that perform each of the blocks of the algorithm in the aforementioned flowcharts of FIGS. 11A and 11B. As such, each block in the aforementioned flowcharts of FIGS. 11A and 11B may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 13:
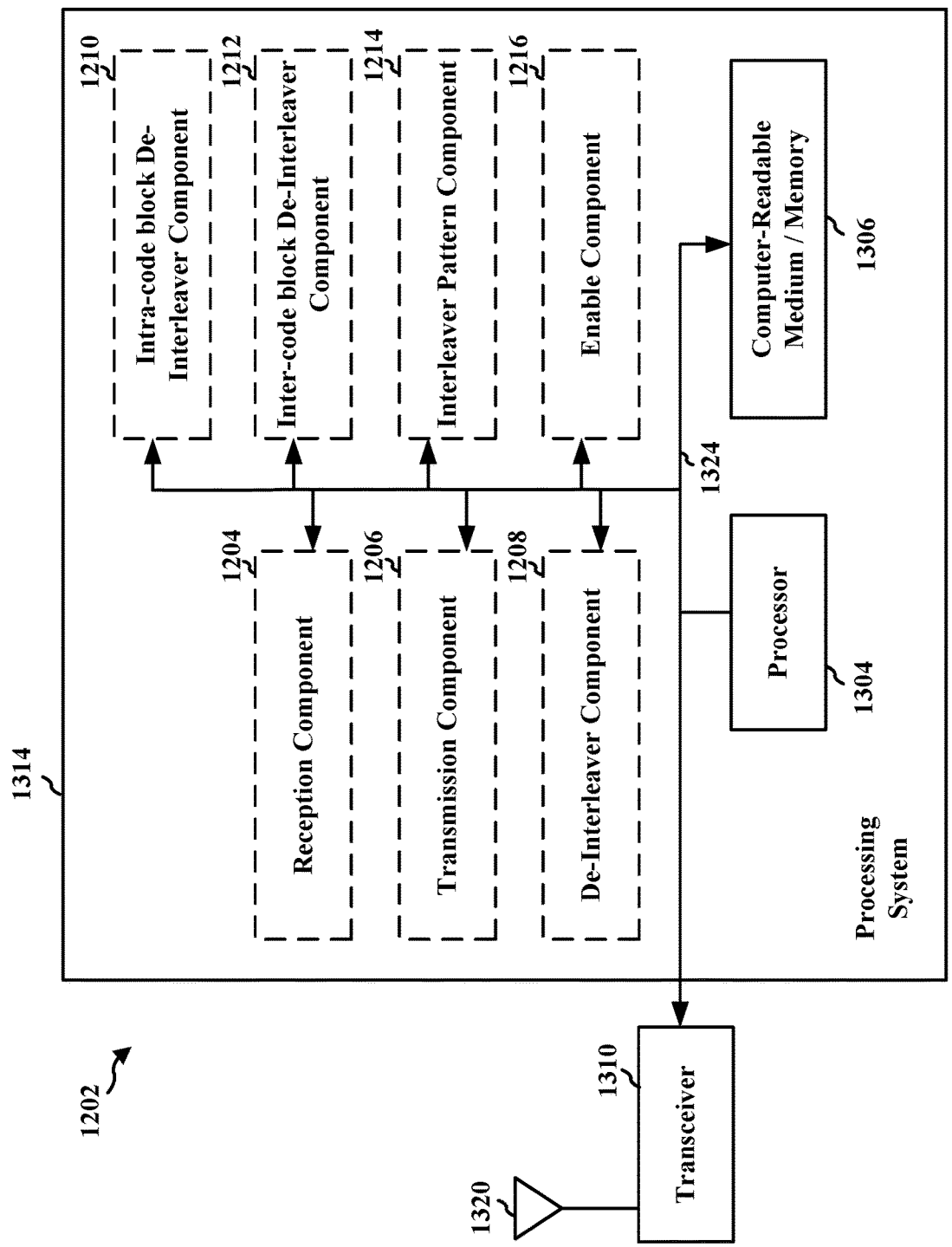
FIG. 13 is a diagram illustrating an example of a hardware implementation for an apparatus employing a processing system in accordance with some aspects of the presented disclosure.

FIG. 13 is a diagram illustrating an example of a hardware implementation for an apparatus 1202 employing a processing system 1314. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors or hardware components, represented by the processor 1304, the components 1204, 1206, 1208, 1210, 1212, 1214, 1216, and the computer-readable medium/memory 1306. The bus 1324 may also link various other circuits such as timing sources, peripherals, voltage regulators, and power management circuits, which are known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the reception component 1204. In addition, the transceiver 1310 receives information from the processing system 1314, specifically the transmission component 1206, and based on the received information, generates a signal to be applied to the one or more antennas 1320. The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system 1314 further includes at least one of the components 1204, 1206, 1208, 1210, 1212, 1214, 1216. The components may be software components running in the processor 1304, resident/stored in the computer readable medium/memory 1306, one or more hardware components coupled to the processor 1304, or some combination thereof. The processing system 1314 may be a component of the UE 350 and may include the memory 360 or at least one of the TX processor 368, the RX processor 356, and the controller/processor 359. Alternatively, the processing system 1314 may be the entire UE (for example, see 350 of FIG. 3).

In one configuration, the apparatus 1202 for wireless communication includes means for receiving a channel from a base station. The apparatus 1202 may include means for de-interleaving received tones of the channel in a frequency domain to obtain code blocks of one or more transport blocks corresponding to a TBS for the channel, the code blocks being interleaved by the base station using tone-level interleaving or the RE-level interleaving. The tone-level interleaving or the RE-level interleaving may include inter-code block interleaving. Therefore, the means for de-interleaving the received tones of the channel may de-interleave the channel using inter-code block de-interleaving. The tone-level interleaving or the RE-level interleaving may include intra-code block interleaving. Therefore, the means for de-interleaving the received tones of the channel may de-interleave the channel using intra-code block de-interleaving. The apparatus 1202 may include means for receiving an indication of an interleaving pattern used for the tone-level interleaving or the RE-level interleaving of the code blocks of the channel. The apparatus 1202 may include means for receiving an indication enables the tone-level interleaving or the RE-level interleaving for the channel. The aforementioned means may be one or more of the aforementioned components of the apparatus 1202 or the processing system 1314 of the apparatus 1202 configured to perform the functions recited by the aforementioned means. As described supra, the processing system 1314 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

The specific order or hierarchy of blocks in the processes/flowcharts disclosed is an illustration of example approaches. Based upon design preferences, the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

In the following, an overview of further examples is provided:

1. A method of wireless communication at a base station, comprising:
 mapping code blocks of a transport block size (TBS) for a physical multicast channel (PMCH) using tone-level interleaving or resource element (RE)-level interleaving; and
 transmitting the code blocks of the TBS for the PMCH.

2. The method of example 1, wherein the tone-level interleaving or the RE-level interleaving comprises inter-code block interleaving.

3. The method of any of examples 1 or 2, wherein the tone-level interleaving or the RE-level interleaving comprises row-column interleaving.

4. The method of example 3, wherein a number of rows or a number of columns in the row-column interleaving is based on a number of code blocks in the TBS.

5. The method of any of examples 3 or 4, wherein a number of rows or a number of columns in the row-column interleaving is based on a largest number of code blocks in a PMCH symbol for a largest modulation and coding scheme (MCS) and TBS entry.

6. The method of any of examples 3 to 5, wherein the mapping of the code blocks using the tone-level interleaving or RE-level interleaving comprises using nil elements for the mapping.

7. The method of any of examples 3 to 6, wherein elements of each column are cyclically shifted according to a cyclic shift value for each column of an interleaving structure.

8. The method of example 7, further comprising:
 generating a random number to determine the cyclic shift value for each column of the interleaving structure.

9. The method of example 8, wherein a random number generator used to generate the cyclic shift value for each column is initialized at least in part with an Multicast Broadcast Single Frequency Network (MBSFN) area identifier (ID) corresponding to a broadcast transmission.

10. The method of any of examples 7 to 9, further comprising:
 generating a random number, wherein the cyclic shift value for each column of the interleaving structure is determined based on a respective portion of the random number.

11. The method of example 10, wherein a random number generator used to generate the random number is initialized at least in part with an Multicast Broadcast Single Frequency Network (MBSFN) area identifier (ID) corresponding to a broadcast transmission.

12. The method of any of examples 3 to 11, wherein elements of each row are cyclically shifted according to a cyclic shift value for each row of an interleaving structure.

13. The method of example 12, further comprising:
 generating a random number to determine the cyclic shift value for each row of the interleaving structure.

14. The method of example 13, wherein a random number generator used to generate the cyclic shift value for each row is initialized at least in part with an Multicast Broadcast Single Frequency Network (MBSFN) area identifier (ID) corresponding to a broadcast transmission.

15. The method of any of examples 12 to 14, further comprising:
 generating a random number, wherein the cyclic shift value for each row of the interleaving structure is determined based on a respective portion of the random number.

16. The method of example 15, wherein a random number generator used to generate the random number is initialized at least in part with an Multicast Broadcast Single Frequency Network (MBSFN) area identifier (ID) corresponding to a broadcast transmission.

17. The method of any of examples 1 to 16, wherein the mapping of the code blocks using the tone-level interleaving or the RE-level interleaving includes interleaving the code blocks using sets of contiguous REs or Physical Resource Blocks (PRBs) as a base unit of the tone-level interleaving or the RE-level interleaving.

18. The method of any of examples 1 to 17, wherein the mapping of the code blocks using the RE-level interleaving includes interleaving the code blocks using single REs as a base unit of the RE-level interleaving.

19. The method of any of examples 1 to 18, further comprising applying the tone-level interleaving or the RE-level interleaving based on a numerology for the PMCH.

20. The method of example 19, wherein the numerology for the PMCH comprises at least one of a cyclic prefix duration, a useful symbol duration, or a subcarrier spacing of a PMCH symbol.

21. The method of any of examples 1 to 20, further comprising applying the tone-level interleaving or the RE-level interleaving based on a system bandwidth.

22. The method of any of examples 1 to 21, further comprising applying the tone-level interleaving or the RE-level interleaving based on one or both of a modulation and coding scheme (MCS) or the TBS.

23. The method of any of examples 1 to 22, further comprising applying the tone-level interleaving or the RE-level interleaving based on a reference signal pattern or a reference signal density for the PMCH.

24. The method of any of examples 1 to 23, further comprising applying the tone-level interleaving or the RE-level interleaving based on at least one of:
a system frame number,
a number of PMCH symbols within an inter-cell acquisition subframe interval, or
a PMCH symbol index following a preceding cell acquisition subframe.

25. The method of any of examples 1 to 24, further comprising applying the tone-level interleaving or the RE-level interleaving based on a combination of at least one of:
a largest TBS,
a reference signal density,
a reference signal pattern,
a combination of a modulation and coding scheme (MCS) and the TBS, or
a system bandwidth.

26. The method of any of examples 1 to 25, wherein the tone-level interleaving or the RE-level interleaving comprises intra-code block interleaving.

27. The method of example 26, wherein the tone-level interleaving or the RE-level interleaving further comprises inter-code block interleaving.

28. The method of any of examples 26 or 27, wherein each code block comprises systematic bits and parity bits, and wherein the intra-code block interleaving spreads the systematic bits across a code block bandwidth.

29. The method of any of examples 26 to 28, further comprising applying the intra-code block interleaving based on a coding rate of the PMCH being below a threshold.

30. The method of any of examples 26 to 29, further comprising applying the intra-code block interleaving based on a combination of a modulation and coding scheme (MCS) and the TBS.

31. The method of any of examples 26 to 30, wherein the intra-code block interleaving comprises row-column interleaving using a number of rows or a number of columns that is based on a coding rate of the PMCH.

32. The method of any of examples 1 to 31, wherein specifications of the tone-level interleaving or the RE-level interleaving are based on a relationship to a configuration of the PMCH.

33. The method of any of examples 1 to 32, further comprising transmitting an indication of an interleaving pattern used for the tone-level interleaving or the RE-level interleaving of the code blocks of the PMCH.

34. The method of example 33, further comprising enabling or disabling the tone-level interleaving or the RE-level interleaving for the PMCH.

35. The method of any of examples 33 or 34, wherein the indication is comprised in at least one of system information or a multicast control channel.

36. The method of example 35, wherein a first interleaving indication for a multicast control channel mapped PMCH is conveyed in system information, and a second interleaving indication for a multicast transport channel mapped PMCH is conveyed in the multicast transport channel mapped PMCH.

37. A method of wireless communication at a user equipment (UE), comprising:
receiving a physical multicast channel (PMCH) from a base station; and
de-interleaving received tones of the PMCH in a frequency domain to obtain code blocks of a transport block size (TBS) for the PMCH, wherein the code blocks are interleaved by the base station using resource element (RE)-level interleaving.

38. The method of example 37, wherein the tone-level interleaving or the RE-level interleaving comprises inter-code block interleaving.

39. The method of any of examples 37 or 38, wherein the tone-level interleaving or the RE-level interleaving comprises row-column interleaving.

40. The method of example 39, wherein a number of rows or a number of columns in the row-column interleaving is based on a number of code blocks in the TBS.

41. The method of any of examples 39 or 40, wherein a number of rows or a number of columns in the row-column interleaving is based on a largest number of code blocks in a PMCH symbol for a largest modulation and coding scheme (MCS) and TBS entry.

42. The method of any of examples 39 to 41, wherein elements of each column are cyclically shifted according to a cyclic shift value for each column of an interleaving structure.

43. The method of example 42, further comprising:
generating a random number to determine the cyclic shift value for each column of the interleaving structure.

44. The method of example 43, wherein a random number generator used to generate the cyclic shift value for each column is initialized at least in part with an Multicast Broadcast Single Frequency Network (MBSFN) area identifier (ID) corresponding to a broadcast transmission.

45. The method of any of examples 42 to 44, further comprising:
generating a random number, wherein the cyclic shift value for each column of the interleaving structure is determined based on a respective portion of the random number.

46. The method of example 45, wherein a random number generator used to generate the random number is initialized at least in part with an Multicast Broadcast Single Frequency Network (MBSFN) area identifier (ID) corresponding to a broadcast transmission.

47. The method of any of examples 39 to 46, wherein elements of each row are cyclically shifted according to a cyclic shift value for each row of an interleaving structure.

48. The method of example 47, further comprising:
generating a random number to determine the cyclic shift value for each row of the interleaving structure.

49. The method of example 48, wherein a random number generator used to generate the cyclic shift value for each row is initialized at least in part with an Multicast Broadcast Single Frequency Network (MBSFN) area identifier (ID) corresponding to a broadcast transmission.

50. The method of any of examples 47 to 49, further comprising:
generating a random number, wherein the cyclic shift value for each row of the interleaving structure is determined based on a respective portion of the random number.

51. The method of example 50, wherein a random number generator used to generate the random number is initialized at least in part with an Multicast Broadcast Single Frequency Network (MBSFN) area identifier (ID) corresponding to a broadcast transmission.

52. The method of any of examples 37 to 51, wherein the code blocks are interleaved using sets of contiguous REs or Physical Resource Blocks (PRBs) as a base unit of the tone-level interleaving or the RE-level interleaving.

53. The method of any of examples 37 to 52, wherein the code blocks are interleaved using single REs as a base unit of the RE-level interleaving.

54. The method of any of examples 37 to 53, wherein the code blocks are interleaved based on at least one of:
a numerology for the PMCH,
a system bandwidth,
a modulation and coding scheme (MCS),
the TBS,
a combination of the MCS and the TBS,
a largest TBS,
a reference signal pattern for the PMCH,
a reference signal density for the PMCH,
a system frame number,
a number of PMCH symbols within an inter-cell acquisition subframe interval,
a PMCH symbol index following a preceding cell acquisition subframe, or
a coding rate of the PMCH being below a threshold.

55. The method of any of examples 37 to 54, wherein the tone-level interleaving or the RE-level interleaving comprises intra-code block interleaving.

56. The method of example 55, wherein the tone-level interleaving or the RE-level interleaving further comprises inter-code block interleaving.

57. The method of any of examples 55 or 56, wherein each code block comprises systematic bits and parity bits, wherein the systematic bits are spread across a code block bandwidth based on the intra-code block interleaving.

58. The method of any of examples 55 to 57, wherein the intra-code block interleaving comprises row-column interleaving using a number of rows or a number of columns that is based on a coding rate of the PMCH.

59. The method of any of examples 37 to 58, wherein specifications of the tone-level interleaving or the RE-level interleaving are based on a relationship to a configuration of the PMCH.

60. The method of any of examples 37 to 59, further comprising receiving an indication of an interleaving pattern used for the tone-level interleaving or the RE-level interleaving of the code blocks of the PMCH.

61. The method of example 60, wherein the indication enables the tone-level interleaving or the RE-level interleaving for the PMCH.

62. The method of example 61, wherein the indication is comprised in at least one of system information or a multicast control channel.

63. The method of example 62, wherein a first interleaving indication for a multicast control channel mapped PMCH is received in system information, and a second interleaving indication for a multicast transport channel mapped PMCH is received in the multicast transport channel mapped PMCH.

64. An apparatus for wireless communication at a base station, comprising:
a memory; and
at least one processor coupled to the memory and configured to:
map code blocks of a transport block size (TBS) for a physical multicast channel (PMCH) using tone-level interleaving or resource element (RE)-level interleaving; and
transmit the code blocks of the TBS for the PMCH.

65. The apparatus of example 64, wherein the tone-level interleaving or the RE-level interleaving comprises inter-code block interleaving.

66. The apparatus of any of examples 64 or 65, wherein the tone-level interleaving or the RE-level interleaving comprises row-column interleaving.

67. The apparatus of example 66, wherein a number of rows or a number of columns in the row-column interleaving is based on a number of code blocks in the TBS.

68. The apparatus of any of examples 66 or 67, wherein a number of rows or a number of columns in the row-column interleaving is based on a largest number of code blocks in a PMCH symbol for a largest modulation and coding scheme (MCS) and TBS entry.

69. The apparatus of any of examples 66 to 68, wherein the mapping of the code blocks using the tone-level interleaving or RE-level interleaving comprises using nil elements for the mapping.

70. The apparatus of any of examples 66 to 69, wherein elements of each column are cyclically shifted according to a cyclic shift value for each column of an interleaving structure.

71. The apparatus of example 70, wherein the at least one processor is further configured to:
generate a random number to determine the cyclic shift value for each column of the interleaving structure.

72. The apparatus of example 71, wherein a random number generator used to generate the cyclic shift value for each column is initialized at least in part with an Multicast Broadcast Single Frequency Network (MBSFN) area identifier (ID) corresponding to a broadcast transmission.

73. The apparatus of any of examples 70 to 72, wherein the at least one processor is further configured to:
generate a random number, wherein the cyclic shift value for each column of the interleaving structure is determined based on a respective portion of the random number.

74. The apparatus of example 73, wherein a random number generator used to generate the random number is initialized at least in part with an Multicast Broadcast Single Frequency Network (MBSFN) area identifier (ID) corresponding to a broadcast transmission.

75. The apparatus of any of examples 66 to 74, wherein elements of each row are cyclically shifted according to a cyclic shift value for each row of an interleaving structure.

76. The apparatus of example 75, wherein the at least one processor is further configured to:
generate a random number to determine the cyclic shift value for each row of the interleaving structure.

77. The apparatus of example 76, wherein a random number generator used to generate the cyclic shift value for each row is initialized at least in part with an Multicast Broadcast Single Frequency Network (MBSFN) area identifier (ID) corresponding to a broadcast transmission.

78. The apparatus of any of examples 75 to 77, wherein the at least one processor is further configured to:
generate a random number, wherein the cyclic shift value for each row of the interleaving structure is determined based on a respective portion of the random number.

79. The apparatus of example 78, wherein a random number generator used to generate the random number is initialized at least in part with an Multicast Broadcast Single Frequency Network (MBSFN) area identifier (ID) corresponding to a broadcast transmission.

80. The apparatus of any of examples 64 to 79, wherein the mapping of the code blocks using the tone-level interleaving or the RE-level interleaving includes interleaving the code blocks using sets of contiguous REs or Physical Resource Blocks (PRBs) as a base unit of the tone-level interleaving or the RE-level interleaving.

81. The apparatus of any of examples 64 to 80, wherein the mapping of the code blocks using the RE-level interleaving includes interleaving the code blocks using single REs as a base unit of the RE-level interleaving.

82. The apparatus of any of examples 64 to 81, wherein the at least one processor is further configured to apply the tone-level interleaving or the RE-level interleaving based on a numerology for the PMCH.

83. The apparatus of example 82, wherein the numerology for the PMCH comprises at least one of a cyclic prefix duration, a useful symbol duration, or a subcarrier spacing of a PMCH symbol.

84. The apparatus of any of examples 64 to 83, wherein the at least one processor is further configured to apply the tone-level interleaving or the RE-level interleaving based on a system bandwidth.

85. The apparatus of any of examples 64 to 84, wherein the at least one processor is further configured to apply the tone-level interleaving or the RE-level interleaving based on one or both of a modulation and coding scheme (MCS) or the TBS.

86. The apparatus of any of examples 64 to 85, wherein the at least one processor is further configured to apply the tone-level interleaving or the RE-level interleaving based on a reference signal pattern or a reference signal density for the PMCH.

87. The apparatus of any of examples 64 to 86, wherein the at least one processor is further configured to apply the tone-level interleaving or the RE-level interleaving based on at least one of:
a system frame number,
a number of PMCH symbols within an inter-cell acquisition subframe interval, or
a PMCH symbol index following a preceding cell acquisition subframe.

88. The apparatus of any of examples 64 to 87, wherein the at least one processor is further configured to apply the tone-level interleaving or the RE-level interleaving based on a combination of at least one of:
a largest TBS,
a reference signal density,
a reference signal pattern,
a combination of a modulation and coding scheme (MCS) and the TBS, or
a system bandwidth.

89. The apparatus of any of examples 64 to 88, wherein the tone-level interleaving or the RE-level interleaving comprises intra-code block interleaving.

90. The apparatus of example 89, wherein the tone-level interleaving or the RE-level interleaving further comprises inter-code block interleaving.

91. The apparatus of any of examples 89 or 90, wherein each code block comprises systematic bits and parity bits, and wherein the intra-code block interleaving spreads the systematic bits across a code block bandwidth.

92. The apparatus of any of examples 89 to 91, wherein the at least one processor is further configured to apply the intra-code block interleaving based on a coding rate of the PMCH being below a threshold.

93. The apparatus of any of examples 89 to 92, wherein the at least one processor is further configured to apply the intra-code block interleaving based on a combination of a modulation and coding scheme (MCS) and the TBS.

94. The apparatus of any of examples 89 to 93, wherein the intra-code block interleaving comprises row-column interleaving using a number of rows or a number of columns that is based on a coding rate of the PMCH.

95. The apparatus of any of examples 64 to 94, wherein specifications of the tone-level interleaving or the RE-level interleaving are based on a relationship to a configuration of the PMCH.

96. The apparatus of any of examples 64 to 95, wherein the at least one processor is further configured to transmit an indication of an interleaving pattern used for the tone-level interleaving or the RE-level interleaving of the code blocks of the PMCH.

97. The apparatus of example 96, wherein the at least one processor is further configured to enable or disable the tone-level interleaving or the RE-level interleaving for the PMCH.

98. The apparatus of any of examples 96 or 97, wherein the indication is comprised in at least one of system information or a multicast control channel.

99. The apparatus of example 98, wherein a first interleaving indication for a multicast control channel mapped PMCH is conveyed in system information, and a second interleaving indication for a multicast transport channel mapped PMCH is conveyed in the multicast transport channel mapped PMCH.

100. An apparatus for wireless communication at a user equipment (UE), comprising:
a memory; and
at least one processor coupled to the memory and configured to:
receive a physical multicast channel (PMCH) from a base station; and
de-interleave received tones of the PMCH in a frequency domain to obtain code blocks of a transport block size (TBS) for the PMCH, wherein the code blocks are interleaved by the base station using resource element (RE)-level interleaving.

101. The apparatus of example 100, wherein the tone-level interleaving or the RE-level interleaving comprises inter-code block interleaving.

102. The apparatus of any of examples 100 or 101, wherein the tone-level interleaving or the RE-level interleaving comprises row-column interleaving.

103. The apparatus of example 102, wherein a number of rows or a number of columns in the row-column interleaving is based on a number of code blocks in the TBS.

104. The apparatus of any of examples 102 or 103, wherein a number of rows or a number of columns in the row-column interleaving is based on a largest number of code blocks in a PMCH symbol for a largest modulation and coding scheme (MCS) and TBS entry.

105. The apparatus of any of examples 102 to 104, wherein elements of each column are cyclically shifted according to a cyclic shift value for each column of an interleaving structure.

106. The apparatus of example 105, wherein the at least one processor is further configured to:
generate a random number to determine the cyclic shift value for each column of the interleaving structure.

107. The apparatus of example 106, wherein a random number generator used to generate the cyclic shift value for each column is initialized at least in part with an Multicast Broadcast Single Frequency Network (MBSFN) area identifier (ID) corresponding to a broadcast transmission.

108. The apparatus of any of examples 105 to 107, wherein the at least one processor is further configured to:
generate a random number, wherein the cyclic shift value for each column of the interleaving structure is determined based on a respective portion of the random number.

109. The apparatus of example 108, wherein a random number generator used to generate the random number is initialized at least in part with an Multicast Broadcast Single Frequency Network (MBSFN) area identifier (ID) corresponding to a broadcast transmission.

110. The apparatus of any of examples 102 to 109, wherein elements of each row are cyclically shifted according to a cyclic shift value for each row of an interleaving structure.

111. The apparatus of example 110, wherein the at least one processor is further configured to:
generate a random number to determine the cyclic shift value for each row of the interleaving structure.

112. The apparatus of example 111, wherein a random number generator used to generate the cyclic shift value for each row is initialized at least in part with an Multicast Broadcast Single Frequency Network (MBSFN) area identifier (ID) corresponding to a broadcast transmission.

113. The apparatus of any of examples 110 to 112, wherein the at least one processor is further configured to:
generate a random number, wherein the cyclic shift value for each row of the interleaving structure is determined based on a respective portion of the random number.

114. The apparatus of example 113, wherein a random number generator used to generate the random number is initialized at least in part with an Multicast Broadcast Single Frequency Network (MBSFN) area identifier (ID) corresponding to a broadcast transmission.

115. The apparatus of any of examples 100 to 114, wherein the code blocks are interleaved using sets of contiguous REs or Physical Resource Blocks (PRBs) as a base unit of the tone-level interleaving or the RE-level interleaving.

116. The apparatus of any of examples 100 to 115, wherein the code blocks are interleaved using single REs as a base unit of the RE-level interleaving.

117. The apparatus of any of examples 100 to 116, wherein the code blocks are interleaved based on at least one of:
a numerology for the PMCH,
a system bandwidth,
a modulation and coding scheme (MCS),
the TBS,
a combination of the MCS and the TBS,
a largest TBS,
a reference signal pattern for the PMCH,
a reference signal density for the PMCH,
a system frame number,
a number of PMCH symbols within an inter-cell acquisition subframe interval,
a PMCH symbol index following a preceding cell acquisition subframe, or
a coding rate of the PMCH being below a threshold.

118. The apparatus of any of examples 100 to 117, wherein the tone-level interleaving or the RE-level interleaving comprises intra-code block interleaving.

119. The apparatus of example 118, wherein the tone-level interleaving or the RE-level interleaving further comprises inter-code block interleaving.

120. The apparatus of any of examples 118 or 119, wherein each code block comprises systematic bits and parity bits, wherein the systematic bits are spread across a code block bandwidth based on the intra-code block interleaving.

121. The apparatus of any of examples 118 or 120, wherein the intra-code block interleaving comprises row-column interleaving using a number of rows or a number of columns that is based on a coding rate of the PMCH.

122. The apparatus of any of examples 100 to 121, wherein specifications of the tone-level interleaving or the RE-level interleaving are based on a relationship to a configuration of the PMCH.

123. The apparatus of any of examples 100 to 122, wherein the at least one processor is further configured to receive an indication of an interleaving pattern used for the tone-level interleaving or the RE-level interleaving of the code blocks of the PMCH.

124. The apparatus of example 123, wherein the indication enables the tone-level interleaving or the RE-level interleaving for the PMCH.

125. The apparatus of example 124, wherein the indication is comprised in at least one of system information or a multicast control channel.

126. The apparatus of example 125, wherein a first interleaving indication for a multicast control channel mapped PMCH is received in system information, and a second interleaving indication for a multicast transport channel mapped PMCH is received in the multicast transport channel mapped PMCH.

What is claimed is:

1. A method of wireless communication at a user equipment (UE), comprising:
camping on a wireless communication cell to receive system information including a multicast or broadcast area identifier corresponding to an area for a multicast or broadcast transmission;
receiving, from a base station, the multicast or broadcast transmission comprising a transport block that includes a plurality of code blocks including multicast or broadcast control information or data, the transport block mapped on a plurality of tones that are tone-level interleaved in a frequency domain based on a row-column interleaving operation using an interleaving structure in which elements of each column of the interleaving structure are cyclically shifted according to a cyclic shift value for the respective column;

initializing a random or pseudo-random number generator, at least in part, with the multicast or broadcast area identifier received in the system information to determine cyclic shift values for the columns of the interleaving structure of the received multicast or broadcast transmission;

performing tone-level de-interleaving of the plurality of tone-level interleaved tones of the multicast or broadcast transmission in the frequency domain based at least in part on determining the cyclic shift values; and obtaining the multicast or broadcast control information or the data based on performing the tone-level de-interleaving of the multicast or broadcast transmission.

2. The method of claim 1, wherein the plurality of tones are tone-level interleaved based on inter-code block interleaving.

3. The method of claim 1, wherein a number of rows or a number of columns in the row-column interleaving operation is based on at least one of a number of the plurality of code blocks in the transport block, or a largest number of the plurality of code blocks in the transport block for a largest modulation and coding scheme (MCS) and TBS entry.

4. The method of claim 1, wherein the cyclic shift value for each column or each row of the interleaving structure is based on a respective portion of the random number.

5. The method of claim 1, wherein the tone-level interleaved tones are de-interleaved using sets of contiguous resource elements (REs) or Physical Resource Blocks (PRBs) as a base unit of the tone-level de-interleaving.

6. The method of claim 1, wherein the plurality of tone-level interleaved tones are de-interleaved using single resource elements (REs) as a base unit of the tone-level de-interleaving.

7. The method of claim 1, wherein the plurality of tone-level interleaved tones are de-interleaved based on at least one of:
a numerology for a channel,
a system bandwidth or assigned bandwidth part,
a modulation and coding scheme (MCS),
a transport block size (TBS),
a combination of the MCS and the TBS,
a largest TBS,
a reference signal pattern for the channel,
a reference signal density for the channel,
a system frame number,
a number of symbols within an inter-cell acquisition interval,
a symbol index following a preceding cell acquisition, or
a coding rate of the channel being below a threshold.

8. The method of claim 1, wherein the tone-level de-interleaving comprises intra-code block de-interleaving.

9. The method of claim 8, wherein the tone-level de-interleaving further comprises inter-code block de-interleaving.

10. The method of claim 8, wherein each code block comprises systematic bits and parity bits, wherein the systematic bits are spread across a code block bandwidth based on the intra-code block de-interleaving.

11. The method of claim 8, wherein the intra-code block de-interleaving comprises row-column de-interleaving using a number of rows or a number of columns that is based on a coding rate of a channel.

12. The method of claim 1, wherein specifications of the tone-level de-interleaving are based on a relationship to a configuration of a channel.

13. The method of claim 1, wherein obtaining the plurality of code blocks includes obtaining code block groups of the plurality of code blocks from de-interleaving the plurality of tone-level interleaved tones of a channel.

14. The method of claim 1, further comprising receiving at least one indication of an interleaving pattern used for a tone-level interleaving of the plurality of tone-level interleaved tones of a channel.

15. The method of claim 14, wherein the at least one indication enables a resource element (RE) level interleaving for the channel.

16. The method of claim 14, wherein the at least one indication is comprised in at least one of the system information or a multicast control channel.

17. The method of claim 16, wherein the at least one indication includes a first interleaving indication and a second interleaving indication, the first interleaving indication for the channel mapped as the multicast control channel is received in the system information, and the second interleaving indication for the channel mapped as a multicast transport channel is received in the multicast control channel.

18. An apparatus for wireless communication at a user equipment (UE), comprising:
a transceiver;
a memory configured to store instructions; and
one or more processors communicatively coupled with the transceiver and the memory, wherein the one or more processors are configured to:
camp on a wireless communication cell to receive system information including a multicast or broadcast area identifier corresponding to an area for a multicast or broadcast transmission;
receive, from a base station, the multicast or broadcast transmission comprising a transport block that includes a plurality of code blocks including multicast or broadcast control information or data, the transport block mapped on a plurality of tones that are tone-level interleaved in a frequency domain based on a row-column interleaving operation using an interleaving structure in which elements of each column of the interleaving structure are cyclically shifted according to a cyclic shift value for the respective column;
initialize a random or pseudo-random number generator, at least in part, with the multicast or broadcast area identifier received in the system information to determine cyclic shift values for the columns of the interleaving structure of the received multicast or broadcast transmission;
perform tone-level de-interleaving of the plurality of tone-level interleaved tones of the multicast or broadcast transmission in the frequency domain based at least in part on determining the cyclic shift values; and
obtain the multicast or broadcast control information or the data based on performing the tone-level de-interleaving of the multicast or broadcast transmission.

19. The apparatus of claim 18, wherein the plurality of tones are tone-level interleaved based on inter-code block interleaving.

20. The apparatus of claim 18, wherein a number of rows or a number of columns in the row-column interleaving operation is based on at least one of a number of the plurality of code blocks in the transport block, or a largest number of the plurality of code blocks in the transport block for a largest modulation and coding scheme (MCS) and TBS entry.

21. The apparatus of claim 18, wherein the tone-level de-interleaving comprises intra-code block de-interleaving.

22. The apparatus of claim 21, wherein the intra-code block de-interleaving comprises row-column de-interleaving using a number of rows or a number of columns that is based on a coding rate of a channel.

23. The method of claim 1, wherein the plurality of tone-level interleaved tones are de-interleaved based on a system bandwidth or assigned bandwidth part.

24. The method of claim 1, wherein the tone-level interleaved tones are de-interleaved based on a modulation and coding scheme (MCS).

25. The method of claim 1, wherein the plurality of tone-level interleaved tones are de-interleaved based on a reference signal pattern for a channel.

26. The method of claim 1, wherein the plurality of tone-level interleaved tones are de-interleaved based on a reference signal density for a channel.

27. The apparatus of claim 21, wherein the tone-level de-interleaving further comprises inter-code block de-interleaving.

28. The apparatus of claim 21, wherein each code block comprises systematic bits and parity bits, wherein the systematic bits are spread across a code block bandwidth based on the intra-code block de-interleaving.

29. The apparatus of claim 18, wherein the plurality of tone-level interleaved tones are de-interleaved based on at least one of a system bandwidth, an assigned bandwidth part, or a modulation and coding scheme (MCS).

30. The apparatus of claim 18, wherein the plurality of tone-level interleaved tones are de-interleaved based on a reference signal pattern for a channel or a reference signal density for the channel.

* * * * *